(12) United States Patent
Oguma et al.

(10) Patent No.: US 6,830,832 B2
(45) Date of Patent: Dec. 14, 2004

(54) POLYMER COMPOUND AND POLYMER LIGHT-EMITTING DEVICE USING THE SAME

(75) Inventors: Jun Oguma, Abiko (JP); Yoshiaki Tsubata, Tsukuba (JP); Shuji Doi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/287,655

(22) Filed: Nov. 5, 2002

(65) Prior Publication Data

US 2003/0165713 A1 Sep. 4, 2003

(30) Foreign Application Priority Data

Nov. 9, 2001 (JP) ........................................ 2001-344482

(51) Int. Cl.$^7$ .......................... H05B 33/14; C09K 11/06
(52) U.S. Cl. ........................ 428/690; 428/917; 313/504; 313/506; 257/40; 252/301.16; 528/422
(58) Field of Search ................................ 428/690, 917; 252/301.16; 313/504, 506; 528/244, 422; 257/40

(56) References Cited

U.S. PATENT DOCUMENTS

| | | | |
|---|---|---|---|
| 4,356,429 A | | 10/1982 | Tang |
| 5,121,029 A | | 6/1992 | Hosokawa et al. |
| 5,281,002 A | * | 1/1994 | Dauphin ................ 297/452.38 |
| 5,759,709 A | * | 6/1998 | Doi et al. .................... 428/690 |
| 5,814,244 A | * | 9/1998 | Kreuder et al. ........ 252/301.16 |
| 5,821,002 A | * | 10/1998 | Ohnishi et al. ............. 428/690 |
| 5,879,821 A | | 3/1999 | Hsieh |
| 5,972,247 A | * | 10/1999 | Shi et al. .................... 252/583 |
| 5,980,781 A | * | 11/1999 | Doi et al. .............. 252/301.16 |
| 6,150,043 A | * | 11/2000 | Thompson et al. ......... 428/690 |
| 6,207,301 B1 | * | 3/2001 | Ohnishi et al. ............. 428/690 |
| 6,403,237 B1 | * | 6/2002 | Noguchi et al. ............ 428/690 |
| 6,444,334 B1 | * | 9/2002 | Doi et al. .................... 428/690 |
| 6,489,045 B1 | * | 12/2002 | Araki et al. ................ 428/690 |
| 6,544,670 B1 | * | 4/2003 | Kitano et al. ............... 428/690 |

FOREIGN PATENT DOCUMENTS

| | | |
|---|---|---|
| EP | 0 918 811 B1 | 12/2000 |
| JP | 57-51781 A | 3/1982 |
| JP | 63-70257 A | 3/1988 |
| JP | 63-175860 A | 7/1988 |
| JP | 02-135361 A | 5/1990 |
| JP | 02-135539 A | 5/1990 |
| JP | 02-209988 A | 8/1990 |
| JP | 03-37992 A | 2/1991 |
| JP | 03-152184 A | 6/1991 |
| JP | 05-202355 A | 8/1993 |
| JP | 09-45478 A | 2/1997 |
| JP | 11-502248 A | 2/1999 |
| JP | 11-246660 A | 9/1999 |

OTHER PUBLICATIONS

Suck–Hoon Shin et al., "Poly(p–pheylene)–based Materials for Light–emitting Diodes: Electroluminescene and Photo–oxidation", *Synthetic Metals*, vol. 102, 1999, pp. 1060–1062.

\* cited by examiner

*Primary Examiner*—Rena L. Dye
*Assistant Examiner*—Camie S Thompson
(74) *Attorney, Agent, or Firm*—Sughrue Mion, PLLC

(57) ABSTRACT

A polymer compound comprising a repeating unit represented by formula (1) and a repeating unit represented by formula (2),

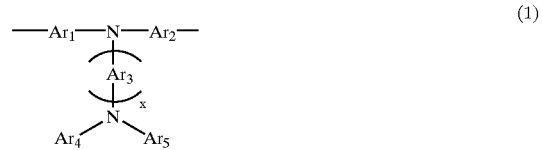

wherein, $Ar_1$, $Ar_2$ and $Ar_6$ each independently represent an arylene group, a divalent heterocyclic compound group, etc.; $Ar_3$ is an arylene group, arylene vinylene group, or a divalent heterocyclic compound group; $Ar_4$ and $Ar_5$ are each independently an aryl group or a monovalent heterocyclic compound group. The polymer compound has excellent characteristics of strong fluorescence and large charge transporting property.

20 Claims, No Drawings

POLYMER COMPOUND AND POLYMER LIGHT-EMITTING DEVICE USING THE SAME

BACKGROUND OF THE INVENTION

1. Field of the Invention

The present invention relates to a polymer compound and an electronic device using the same, especially a polymer light-emitting device using the polymer compound (hereafter, may be referred to as polymer LED).

2. Description of the Related Art

Electronic materials using a polymer compound are variously studied as for electronic device. For example, unlike low molecular weight materials, a high molecular weight light-emitting material having fluorescence in the solid state (polymeric fluorescent substance) is soluble in organic solvents, and can be formed into a light emitting layer of light emitting device by a coating method, thus it has been vigorously studied. As polymeric materials which can be used for polymer LED as a light-emitting material or a charge transporting material, polyphenylene vinylene derivatives, poly fluorene derivatives, polyphenylene derivatives, etc. have been known conventionally. For example, JP-W-11-502248 discloses a copolymer of oligo phenylene. The one example is oligophenylenevinylene. JP-A-11-246660 discloses a copolymer of aromatic amine compound group and unsaturated double bond group. Specifically, the copolymer of triphenylamine dimer and unsubstituted terphenylene are disclosed. Furthermore, as polymeric materials containing 2,5-dialkoxyphenylene, copolymers such as phenylene, thiophene, pyridine, biphenylene, and bithiophene, are disclosed (Synthetic Metals, vol. 102, p. 1060 (1999)).

Under such a situation, required are: a polymer compound having excellent characteristics, that is, strong fluorescence and large charge transporting property; and an electronic device of a high function property using thereof.

Among them, especially required are: a polymer compound having excellent characteristics, that is, strong fluorescence and large charge transporting property; and a polymer LED of high efficiency, such as high light emitting efficiency, and low-voltage driving, and longer operating life.

The object of the present invention is to provide a polymer compound having excellent characteristics, that is, strong fluorescence strength and large charge transporting property, and a highly efficient electronic device using the same. Especially, it is to provide a polymer compound having strong fluorescence and/or excellent charge transporting property, and a highly efficient polymer LED using said polymer compound, which can be driven at a low potential and high efficiency.

SUMMARY OF THE INVENTION

As a result of intensive studies to solve the above problems, the present inventor etc. found that a polymer compound having a polystyrene reduced number average molecular weights of $10^3$–$10^8$, and comprising one or more of repeating units represented by following formula (1) and formula (2), respectively, has excellent characteristics, and completed the present invention. Especially when the polymer compound emits fluorescence in the solid state, a polymer LED of high performance, such as low-voltage and highly efficient driving can be obtained by using said polymer compound.

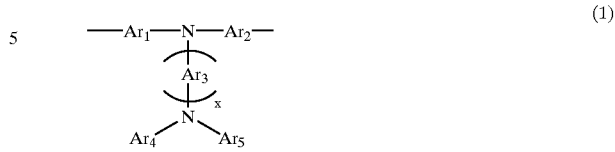

wherein, $Ar_1$ and $Ar_2$ each independently represent an arylene group or a divalent heterocyclic compound group; $Ar_3$ is an arylene group, arylene vinylene group, or a divalent heterocyclic compound group; x is 1 to 10; when x is two or more, $Ar_3$s may be the same or different; $Ar_4$ and $Ar_5$ are each independently an aryl group or a monovalent heterocyclic compound group,

wherein, $Ar_6$ is a phenylene group, stilbene-diyl group, distilbene-diyl group, fluorene-diyl group, divalent condensed polycyclic aromatic compound group, divalent monocyclic hetero-ring group, divalent condensed polycyclic hetero-ring compound group, or divalent aromatic amine compound group.

DETAILED DESCRIPTION OF THE INVENTION

The polymer compound of the present invention has a polystyrene reduced number average molecular weights of $10^3$–$10^8$, and comprises one or more kinds of repeating units represented by the above formula (1) and formula (2), respectively. Among them, a polymer compound having fluorescence in the solid state is suitably used as a light-emitting material (polymeric fluorescent substance).

The repeating unit represented by formula (1) in the polymer compound of the present invention is explained.

$Ar_1$ and $Ar_2$ which are contained in the repeating unit represented by formula (1) are an arylene group or a divalent heterocyclic compound group, each independently; and $Ar_3$ is an arylene group, arylene vinylene group, or a divalent heterocyclic compound group.

In the present invention, the aryl group is an atomic group in which one hydrogen atom is removed from an aromatic hydrocarbon. The arylene group is an atomic group in which two hydrogen atoms are removed from an aromatic hydrocarbon. The aromatic hydrocarbon also includes those containing a condensed ring, and two or more of independent benzene rings or condensed rings bonded through a group such as a direct bond, a vinylene group or the like.

In the present invention, the monovalent heterocyclic compound group means an atomic group in which one hydrogen atom is removed from a heterocyclic compound. The divalent heterocyclic compound group means an atomic group in which two hydrogen atoms are removed from a heterocyclic compound.

The heterocyclic compound means an organic compound having a cyclic structure in which at least one heteroatom such as oxygen, sulfur, nitrogen, phosphorus, boron, arsenic, silicon, etc. is contained in the cyclic structure as the element other than carbon atom.

In formula (1), x represents an integer of 1 to 10, preferably 1 to 5, and more preferably 1 to 3.

The above $Ar_1$, $Ar_2$ and $Ar_3$ may have a substituent. And as the substituent, an alkyl group, alkoxy group, alkylthio group, alkyl silyl group, an aryl group, aryloxy group, aryl silyl group, an aryl alkyl group, aryl alkoxy group, aryl alkyl silyl group, aryl alkenyl group, aryl alkynyl group, a monovalent heterocyclic compound group, etc. are exemplified. When $Ar_3$ has a substituent, the substituents may be connected to form a ring. When $Ar_4$ and $Ar_5$ have a substituent, the substituents may be connected to form a ring and the ring may be bonded by a single bond.

The alkyl group may be any of linear, branched or cyclic, and usually has about 1 to 20 carbon atoms, and specific examples thereof include methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, etc., and preferable are pentyl group, hexyl group, octyl group, 2-ethylhexyl group, decyl group, and 3,7-dimethyloctyl group.

The alkoxy group may be any of linear, branched or cyclic, and usually has about 1 to 20 carbon atoms, and specific examples thereof include methoxy group, ethoxy group, propyloxy group, 1-propyloxy group, butoxy group, i-butoxy group, t-butoxy group, pentyloxy group, isoamyloxy group, hexyloxy group, cyclohexyl oxy group, heptyloxy group, octyloxy group, 2-ethylhexyloxy group, nonyloxy group, decyloxy group, 3,7-dimethyloctyloxy group, lauryloxy group, etc., and preferable are pentyloxy group, isoamyl oxy group, hexyloxy group, octyloxy group, 2-ethylhexyloxy group, decyloxy group, and 3,7-dimethyloctyloxy group.

The alkylthio group may be any of linear, branched or cyclic, and usually has about 1 to 20 carbon atoms, and specific examples thereof include methylthio group, ethylthio group, propylthio group, and i-propylthio group, butylthio group, i-butylthio group, t-butylthio group, pentylthio group, isoamylthio group, hexylthio group, cyclo hexylthio group, heptylthio group, octylthio group, 2-ethylhexylthio group, nonylthio group, decylthio group, 3,7-dimethyloctylthio group, laurylthio group, etc., and preferable are pentylthio group, isoamylthio group, hexylthio group, octylthio group, 2-ethylhexylthio group, decylthio group, and 3,7-dimethyloctylthio group.

The alkylsilyl group may be any of linear, branched or cyclic, and usually has about 1 to 60 carbon atoms, and specific examples thereof include methylsilyl group, ethylsilyl group, propylsilyl group, i-propylsilyl group, butylsilyl group, i-butylsilyl group, t-butylsilyl group, pentylsilyl group, isoamylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethyl silyl group, propyldimethylsilyl group, i-propyldimethylsilyl group, butyldimethylsilyl group, t-butyldimethylsilyl group, pentyldimethylsilyl group, hexyldimethylsilyl group, heptyl dimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group etc., and preferable are a pentylsilyl group, hexylsilyl group, octylsilyl group, 2-ethylhexylsilyl group, decylsilyl group, 3,7-dimethyloctyl silyl group, pentyldimethylsilyl group, isoamyldimethylsilyl group, hexyldimethylsilyl group, octyldimethylsilyl group, 2-ethylhexyl-dimethylsilyl group, decyldimethyl silyl group, 3,7-dimethyloctyl-dimethylsilyl group.

The aryl group is an atomic group of an aromatic hydrocarbon in which a hydrogen atom is removed, and usually has about 6 to 60 carbon atoms. Examples of the aryl group include a phenyl group, C1–C12 alkylphenyl groups (C1–C12 shows 1 to 12 carbon atoms), 1-naphtyl group, 2-naphtyl group, etc., and preferable are phenyl group, and C1–C12 alkyl phenyl group.

The aryloxy group usually has about 6 to 60 carbon atoms. Specific examples thereof include a phenoxy group, C1–C12 alkoxyphenoxy group, C1–C12 alkylphenoxy group, 1-naphtyl oxy group, 2-naphtyloxy group, etc., and preferable are phenoxy group, C1–C12 alkoxyphenoxy group, and C1–C12 alkylphenoxy group.

The arylsilyl group usually has about 7 to 60 carbon atoms. Specific examples thereof include a phenyldimethylsilyl group, C1–C12 alkoxyphenyldimethylsilyl group, C1–C12 alkylphenyldimethylsilyl group, 1-naphtyldimethylsilyl group, 2-naphtyl-dimethylsilyl group, etc., and preferable are C1–C12 alkoxyphenyldimethyl silyl group and C1–C12 alkylphenyldimethylsilyl group.

The arylalkyl group usually has about 7 to 60 carbon atoms. Specific examples thereof include a phenyl-C1–C12 alkyl group, C1–C12 alkoxy phenyl-C1–C12 alkyl group, C1-C12 alkylphenyl-C1–C12 alkyl group, 1-naphtyl-C1–C12 alkyl group, 2-naphtyl-C1–C12 alkyl group, etc., and preferable are C1–C12 alkoxyphenyl-C1–C12 alkyl group, and C1–C12 alkylphenyl-C1–C12 alkyl group.

The arylamino group usually has about 6 to 60 carbon atoms. Specific examples thereof include a phenylamino group, diphenylamino group, C1–C12 alkoxyphenyl amino group, di(C1–C12 alkoxyphenyl)amino group, di(C1–C12 alkylphenyl)amino group, 1-naphtylamino group, 2-naphtylamino group, etc., and preferable are C1–C12 alkylphenylamino group, and di(C1–C12 alkylphenyl) amino group.

The arylalkoxy group usually has about 7 to 60 carbon atoms. Specific examples thereof include a phenyl-C1–C12 alkoxy group, C1–C12 alkoxyphenyl-C1–C12 alkoxy group, C1–C12 alkylphenyl-C1–C12 alkoxy group, 1-naphtyl-C1–C12 alkoxy group, 2-naphtyl-C1–C12 alkoxy group, etc., and preferable are C1–C12 alkoxyphenyl-C1–C12 alkoxy group, and C1–C12 alkylphenyl-C1–C12 alkoxy group.

The arylalkylsilyl group usually has about 7 to 60 carbon atoms. Specific examples thereof include a phenyl-C1–C12 dimethylsilyl group, C1–C12 alkoxyphenyl-C1–C12 dimethylsilyl group, C1–C12 alkylphenyl-C1–C12 dimethyl silyl group, 1-naphtyl-C1–C12 dimethylsilyl group, 2-naphtyl-C1–C12 dimethylsilyl group, etc., and preferable are C1–C12 alkoxyphenyl-C1–C12 dimethylsilyl group, and C1–C12 alkylphenyl-C1–C12 dimethylsilyl group.

The arylalkenyl group usually has about 8 to 60 carbon atoms. Specific examples thereof include a phenyl-C1–C12 alkenyl group, C1–C12 alkoxyphenyl-C1–C12 alkenyl group, C1–C12 alkylphenyl-C1–C12 alkenyl group, 1-naphtyl-C1–C12 alkenyl group, 2-naphtyl-C1–C12 alkenyl group, etc., and preferable are C1–C12 alkoxyphenyl-C1–C12 alkenyl group, and C1–C12 alkylphenyl-C1–C12 alkenyl group.

The arylalkynyl group usually has about 8 to 60 carbon atoms. Specific examples thereof include a phenyl-C1–C12 alkynyl group, C1–C12 alkoxyphenyl-C1–C12 alkynyl group, C1–C12 alkylphenyl-C1–C12 alkynyl group, 1-naphtyl-C1–C12 alkynyl group, 2-naphtyl-C1–C12 alkynyl group, etc., and preferable are C1–C12 alkoxyphenyl-C1–C12 alkynyl group, and C1–C12 alkylphenyl-C1–C12 alkynyl group.

The monovalent heterocyclic compound group is an atomic group of a heterocyclic compound group in which a hydrogen atom is removed, and usually has about 4 to 60, preferably 4 to 20 carbon atoms. The number of carbon atoms of heterocyclic compound group does not include the number of carbon atoms of a substituent. Specifically, a thienyl group, C1–C12 alkylthienyl groups, pyrrolyl group, furyl group, pyridyl group, C1–C12 alkylpyridyl groups and the like are exemplified, and preferable are a thienyl group, C1–C12 alkylthienyl groups, pyridyl group are C1–C12 alkylpyridyl groups.

In the examples of substituents containing an alkyl chain may be linear, branched or cyclic one, or the combination thereof. As the alkyl chain exemplified are isoamyl group, 2-ethylhexyl group, 3,7-dimethyloctyl group, cyclohexyl group, 4-C1–C12 alkylcyclohexyl group, etc. Moreover, adjacent substituents may be mutually connected to form a ring. Furthermore, a part of carbon atoms in the alkyl chain may be replaced by a group containing a hetero atom. Here, as the hetero atom, an oxygen atom, a sulfur atom, a nitrogen atom, etc. are exemplified.

Examples of the group containing a hetero atom include followings.

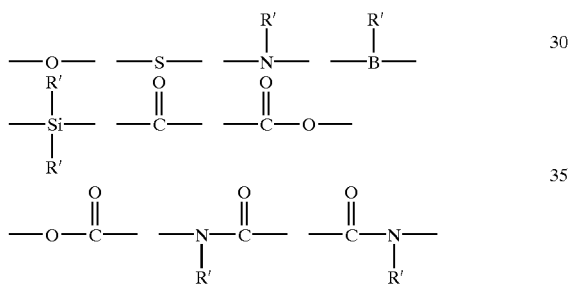

Here, as R', exemplified are a hydrogen atom, alkyl groups having 1–20 carbon atoms, aryl groups having 6–60 carbon atoms, and monovalent heterocyclic compound groups having 4–60 carbon atoms.

As the arylene group, exemplified are phenylene group (for example, following formulas 1–3), naphthalene diyl group (following formulas 4–13), anthracenylene group (following formulas 14–19), biphenylene group (following formulas 20–25), triphenylene group (following formulas 26–28), condensed-ring compound group (following formulas 29–38), etc. Among them, phenylene group, biphenylene group, fluorene-diyl group (following formulas 36–38) and indenofluorene-diyl (following formulas 38A–38B) are preferable.

1

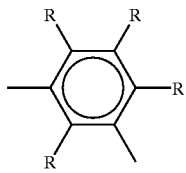

2

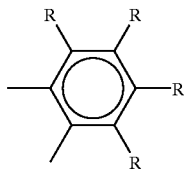

3

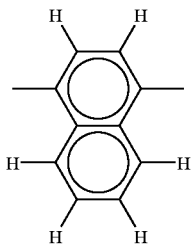

4

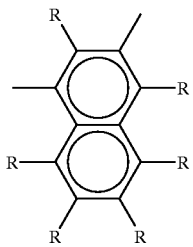

5

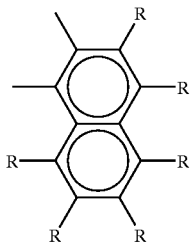

6

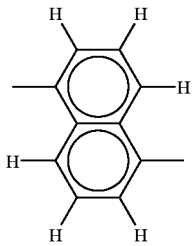

7

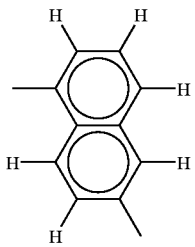

8

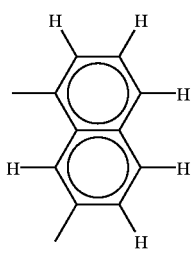
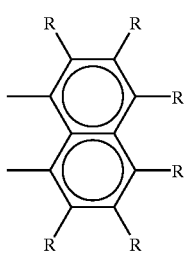
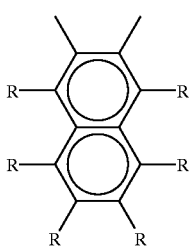
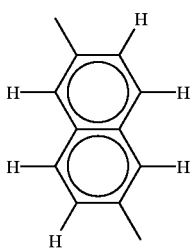
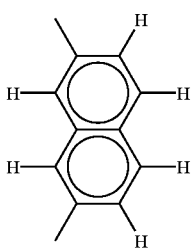
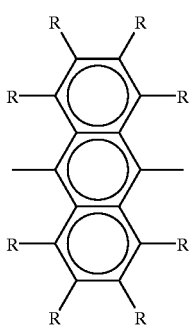
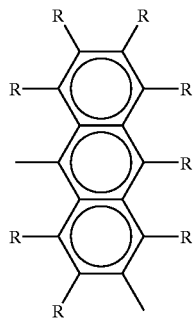
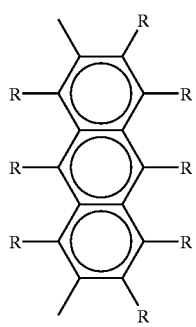
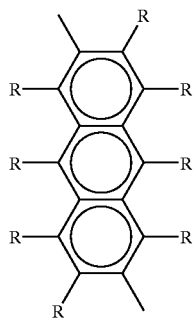
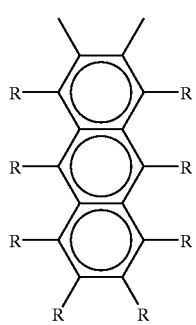
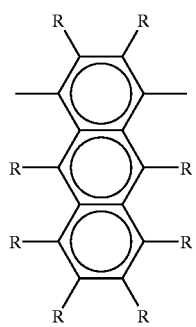

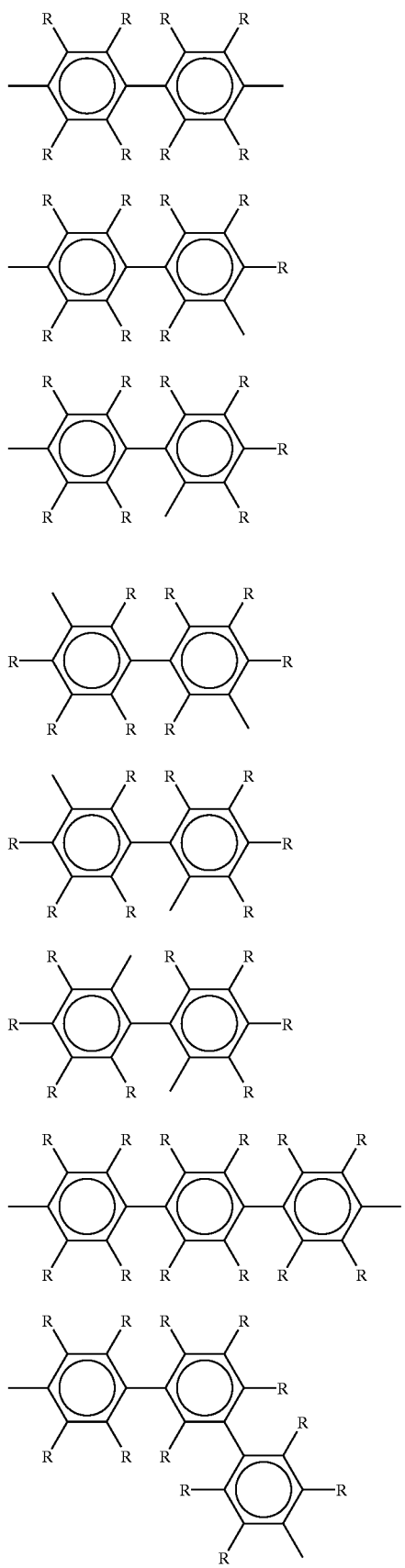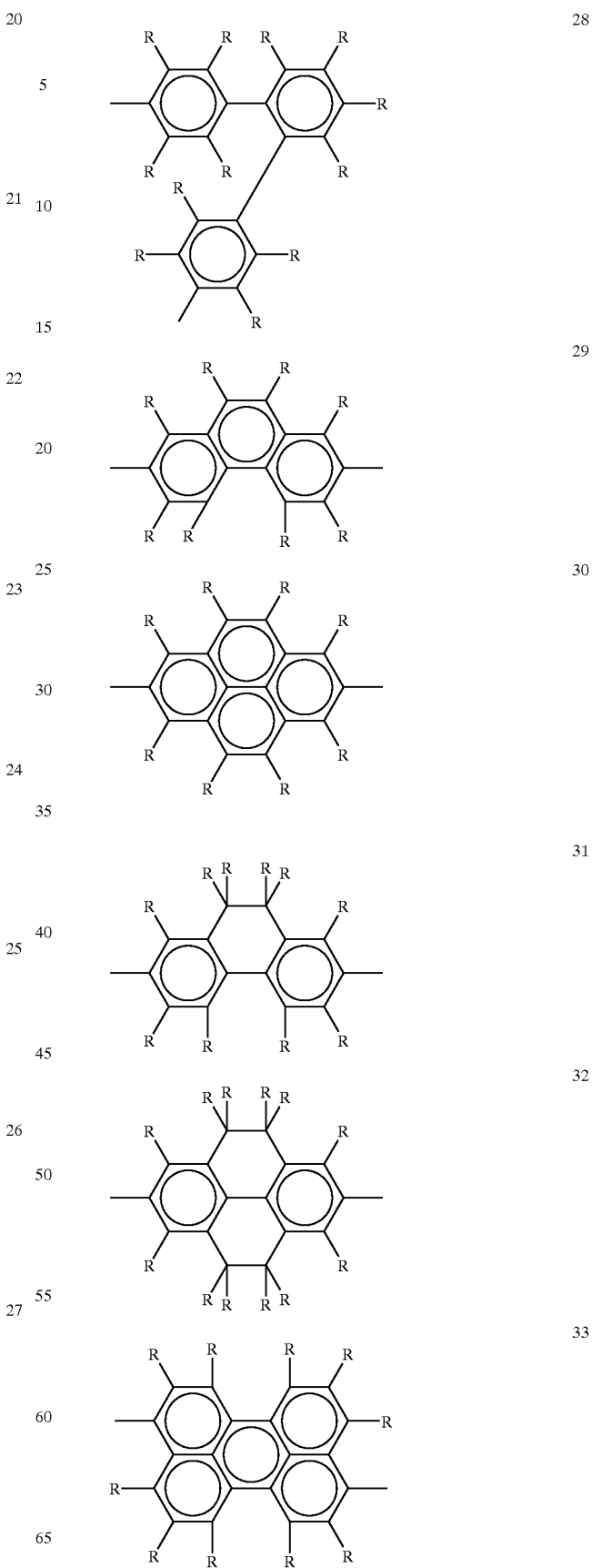

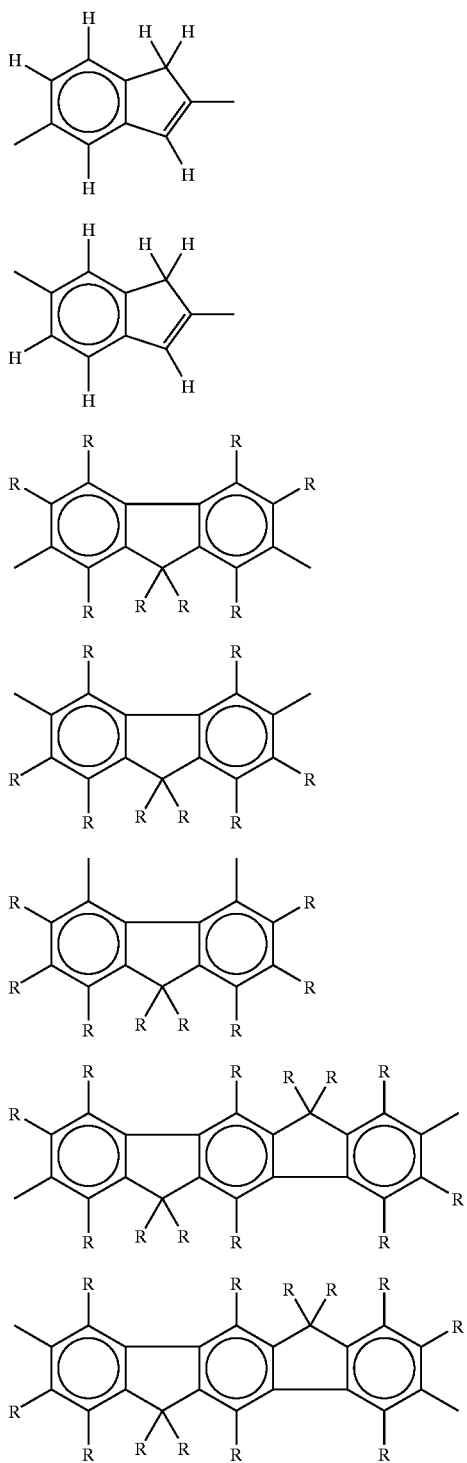

In the present invention, as the divalent heterocyclic compound group, followings are exemplified.

Groups containing a nitrogen as a hetero atom; pyridine-diyl group (following formulas 39–44), diaza phenylene group (following formulas 45–48), quinolinediyl group (following formulas 49–63), quinoxaline diyl group (following formulas 64–68), acridine diyl group (following formulas 69–72), bipyridyl diyl group (following formulas 73–75), phenanthroline diyl group (following formulas 76–78), etc.; groups containing a hetero atom, such as oxygen, silicon, nitrogen, sulfur, selenium, etc. and having a fluorene structure (following formulas 79–93); 5 membered-ring heterocyclic compound groups containing a hetero atom such as oxygen, silicon, nitrogen, sulfur, selenium, etc. (following formulas 94–98); 5 membered-ring condensation heterocyclic compound groups containing a hetero atom such as silicon, nitrogen, sulfur, selenium, etc. (following formulas 99–110); and groups in which 5 membered ring heterocyclic compound group containing silicon, nitrogen, sulfur, selenium, etc. as a hetero atom is connected with a phenyl group at the α position of the hetero atom (following formulas 111–119).

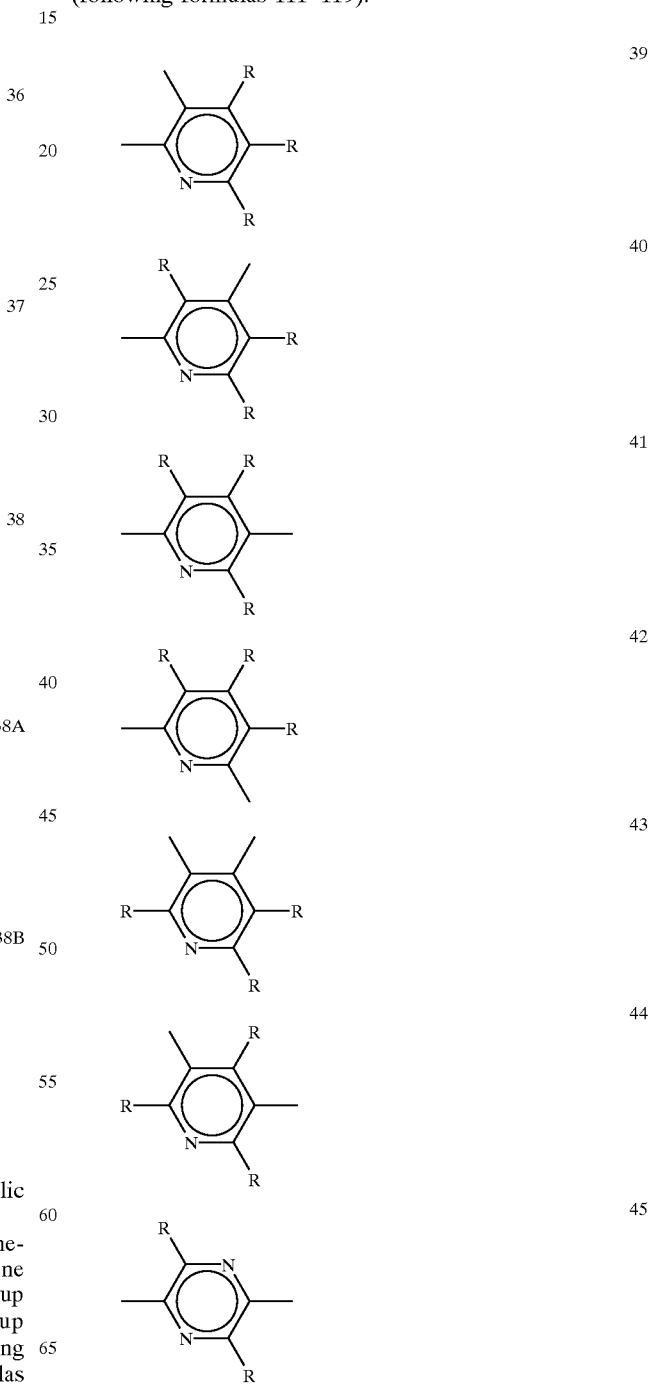

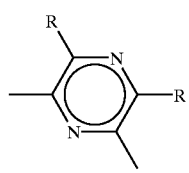
46
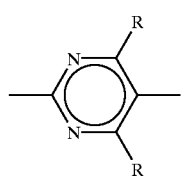
47
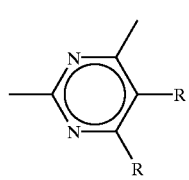
48
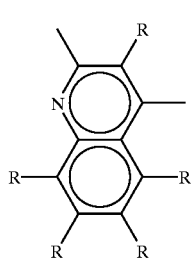
49
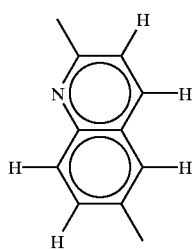
50
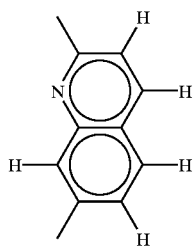
51
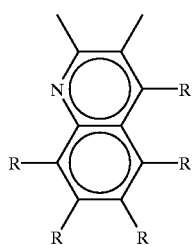
52
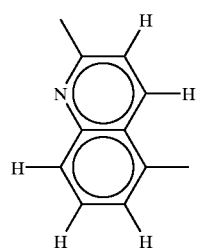
53
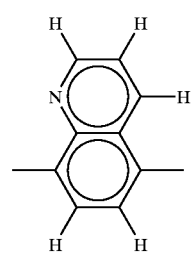
54
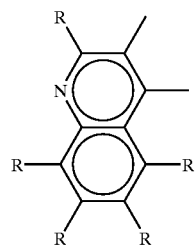
55
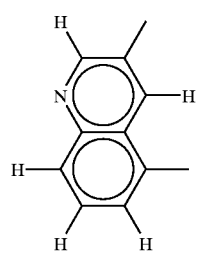
56
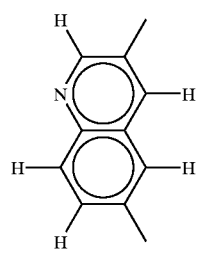
57
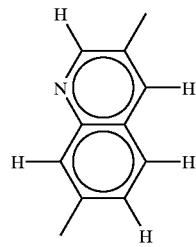
58

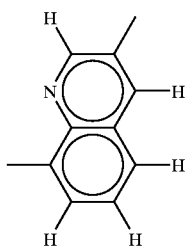
59
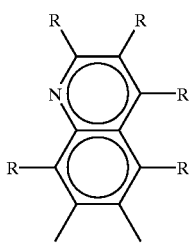
60
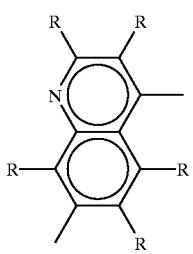
61
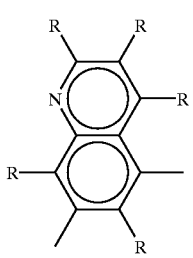
62
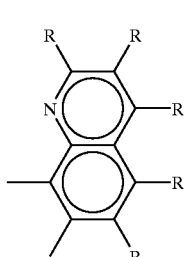
63
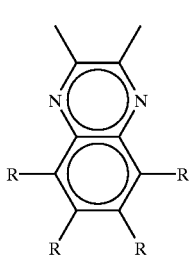
64
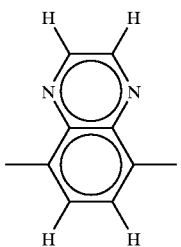
65
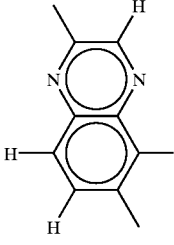
66
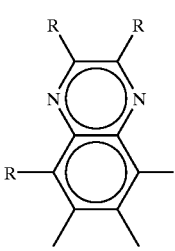
67
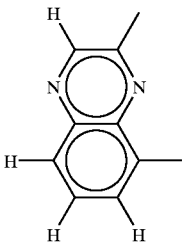
68
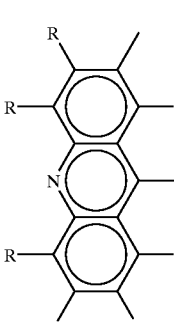
69
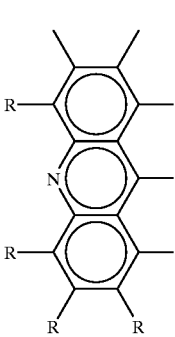
70

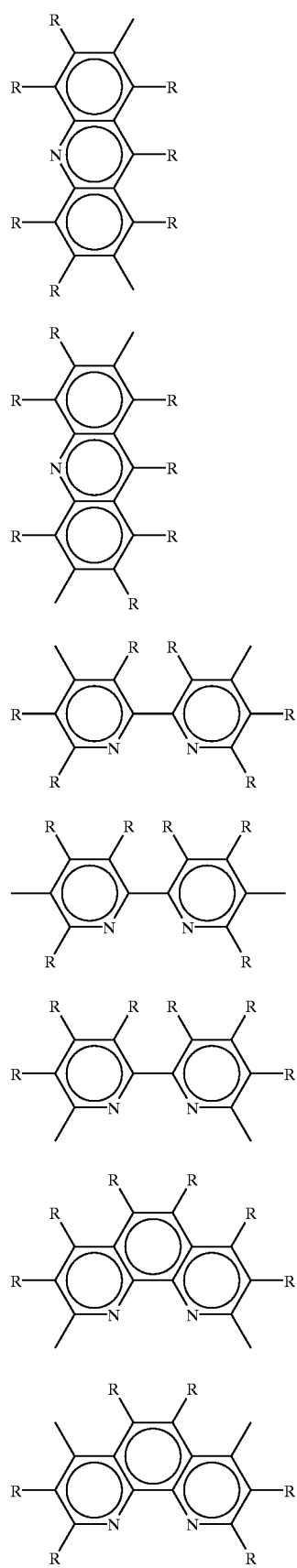
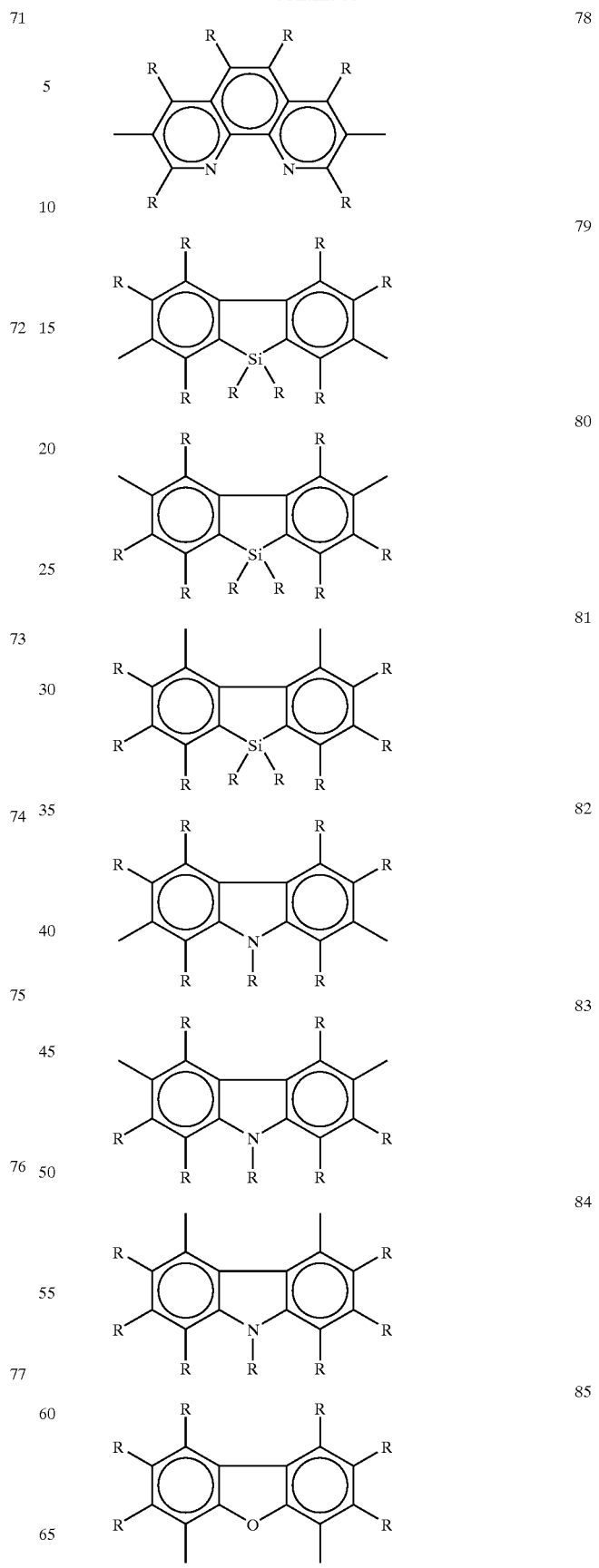

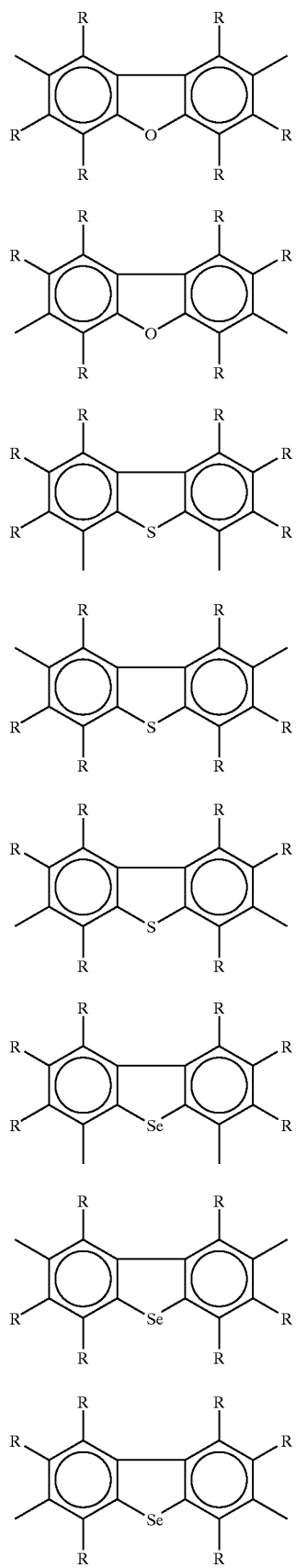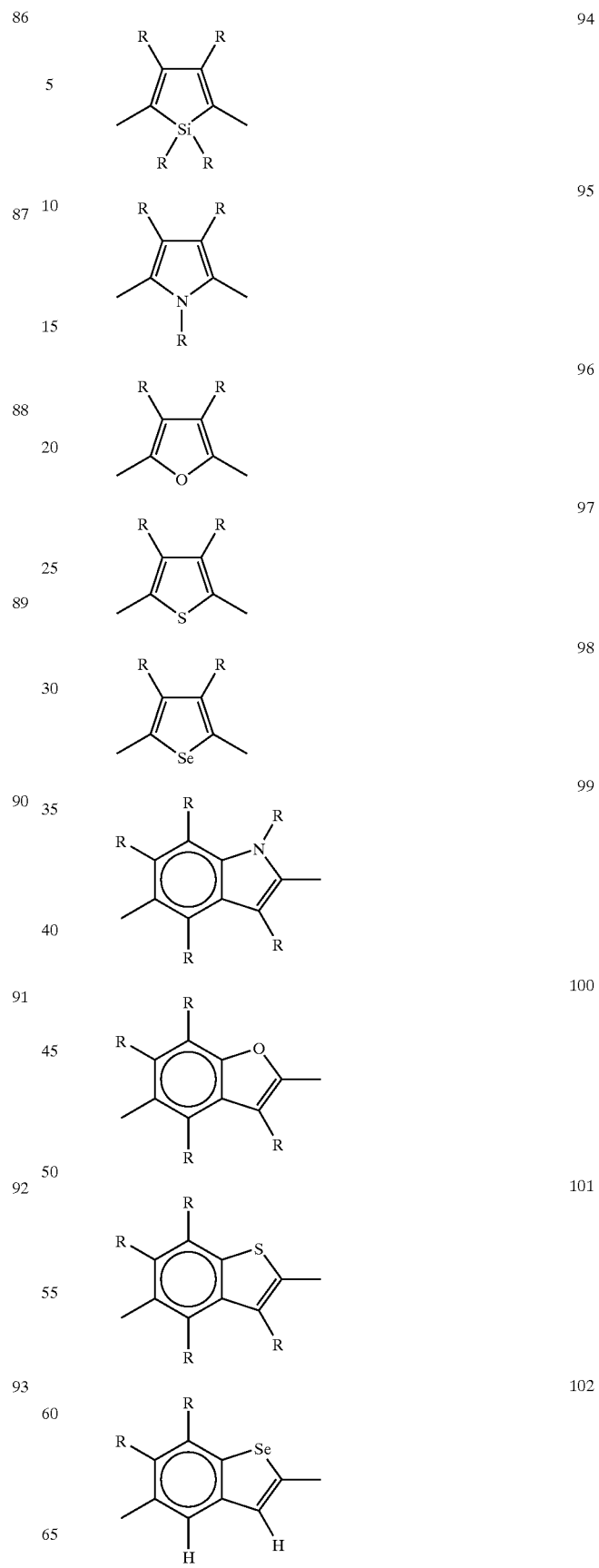

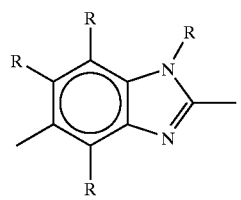
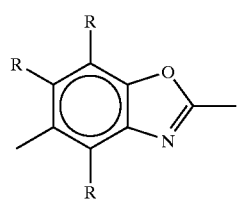
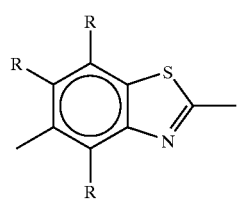
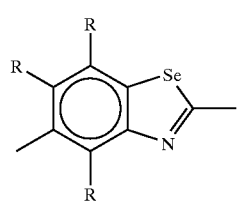
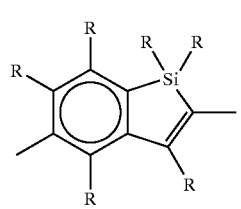
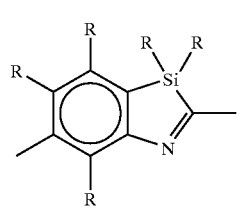
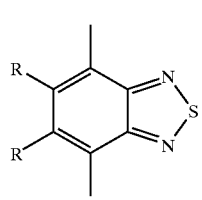
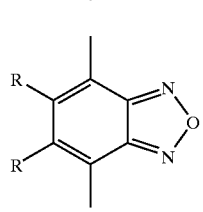
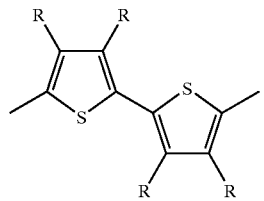
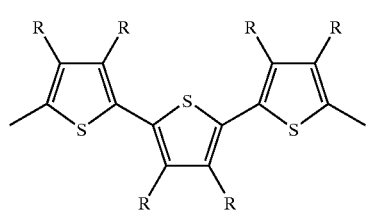
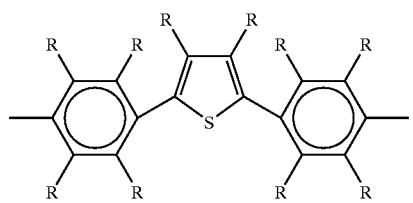
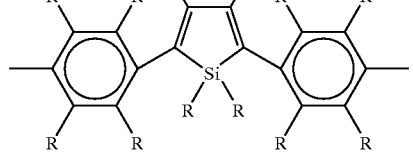
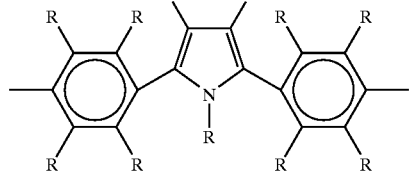
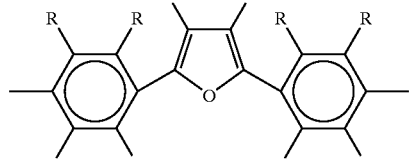
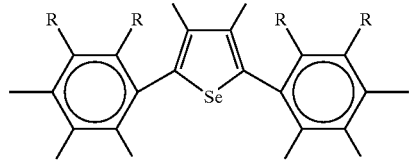
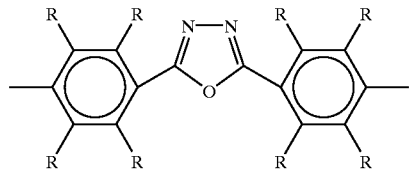

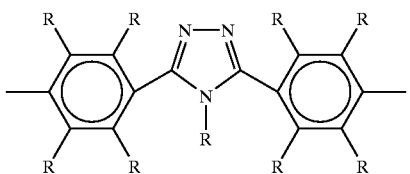
(119)

In the above Ar₃, the arylene vinylene group means a group in which arylene groups are connected with vinylene groups.

In each examples of the above $Ar_1$, $Ar_2$, and $Ar_3$, R include a hydrogen atom, alkyl group, alkoxy group, alkylthio group, aryl group, aryloxy group, arylalkyl group, arylalkoxy group, arylalkenyl group, aryl alkynyl group, monovalent heterocyclic compound group, cyano group, etc. In the above examples of $Ar_1$, $Ar_2$, and $Ar_3$, although a plurality of Rs are contained in one structural formula, they may be the same or different, and are chosen each independently. The carbon atom in the substituent of $Ar_1$, $Ar_2$, and $Ar_3$ may be replaced with oxygen atom or sulfur atom. Furthermore, hydrogen atom may be replaced with fluorine atom.

In $Ar_1$ and $Ar_2$, phenylene, naphthalene-diyl, anthracene-diyl, phenanthrene, pyridine-diyl, and quinoxaline-diyl are preferable. Phenylene, pyridine-diyl, and naphthalene-diyl are more preferable, and phenylene is especially preferable.

$Ar_3$ of the above formula (1) is suitably a group represented by following formula (3).

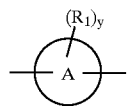
(3)

wherein, Ring A represents phenylene, biphenylene, terphenylene, fluorene-diyl, naphthalene-diyl, anthracene-diyl, phenanthrene-diyl, pyridine-diyl, quinoxaline-diyl, or thienylene, and preferably phenylene, biphenylene, terphenylene or fluorene-diyl; $R_1$ represents an alkyl group, alkoxy group, alkylthio group, alkyl silyl group, aryl group, aryloxy group, arylsilyl group, arylalkyl group, arylalkoxy group, arylalkylsilyl group, arylalkenyl group, arylalkynyl group, monovalent heterocyclic compound group, or cyano group; y represents an integer of 0 to 4, and when y is two or more, a plurality of $R_1$s may be the same or different.

In $R_1$, an alkyl group, alkoxy group, aryl group, aryloxy group, arylsilyl group, arylalkyl group, and arylalkoxy group are preferable, and alkyl group, alkoxy group, aryl group, and aryloxy group are more preferable.

As the specific examples, exemplified are the same substituents as those of $Ar_1$, $Ar_2$ and $Ar_3$.

$Ar_3$ in formula (1) is preferably a group represented by following formula (4).

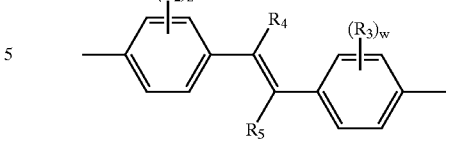
(4)

In the formula, $R_2$ and $R_3$ each independently represent the same as those of $R_1$. $R_4$ and $R_5$ each independently represent a hydrogen atom, alkyl group, aryl group, arylalkyl group, monovalent heterocyclic compound group, or cyano group. Specific examples of alkyl group, aryl group, arylalkyl group and monovalent heterocyclic compound group are the same as those of $R_1$.

When $Ar_3$ in formula (1) is formula (4), x is suitably 1–5, and further suitably 1–3, and especially suitably 1.

Here, the aryl group represented by $Ar_4$ or $Ar_5$ has about 6 to 60, preferably 6 to 30 carbon atoms, and is an atomic group in which one hydrogen atom is removed from a monocyclic aromatic compound, or a condensed polycyclic aromatic compound. Specifically, phenyl, naphtyl, anthracenyl, phenanthrenyl, pyrenyl, perylenyl, naphthacenyl, pentacenyl, chrysenyl, coronyl, etc., and phenyl, naphtyl, and anthracenyl are preferable. Furthermore, phenyl is more preferable.

The monocyclic hetero-ring compound and the condensed polycyclic hetero-ring compound group represented by $Ar_4$ and $Ar_5$ mean those having a cyclic structure in which at least one heteroatom such as oxygen, sulfur, nitrogen, phosphorus, boron, etc. is contained in the cyclic structure as the element other than carbon atom. The number of carbon atoms contained in the cyclic structure is preferably about 4–60, and more preferably 4–30. Specifically, pyridyl, pyrimidyl, pyrazyl, thienyl, furyl, pyroryl, imidazolyl, oxadiazoyl, quinolyl, quinoxalyl, acridinyl, phenanthrolinyl, benzoxazolyl, benzothiazolyl, benzo oxadiazolyl, benzothadiazolyl, dibenzofuryl, dibenzothienyl, carbazolyl, etc. are exemplified, and pyridyl, pyrimidyl, thienyl, oxadiazoyl, quinoline, benzo oxadiazole, benzo thiadiazole, and carbazole are preferable. $Ar_4$ and $Ar_5$ may have a substituent, and as the substituent, an alkyl group, alkoxy group, alkylthio group, alkylsilyl group, aryl group, aryloxy group, arylsilyl group, arylalkyl group, arylalkoxy group, arylalkyl silyl group, arylalkenyl group, arylalkynyl group, monovalent heterocyclic compound group, etc. are exemplified. Adjacent substituents may mutually connected to form a ring. Furthermore, $Ar_4$ and $Ar_5$ may be connected by carbon-carbon single bond to form a carbazole ring.

Next, the repeating unit represented by formula (2) contained in the polymer compound of the present invention is explained.

$Ar_6$ represented by formula (2) is phenylene group, stilbene-diyl group, distilbene-diyl group, fluorene-diyl group, divalent condensed polycyclic aromatic compound group, divalent condensed polycyclic hetero-ring compound group, or divalent aromatic amine compound group. $Ar_6$ may have a substituent. As the substituent, an alkyl group, alkoxy group, alkylthio group, alkylsilyl group, aryl group, aryloxy group, arylsilyl group, arylalkyl group, arylalkoxy group, arylalkylsilyl group, arylalkenyl group, arylalkynyl group, monovalent heterocyclic compound group, etc. are exemplified. When $Ar_6$ has a plurality of substituents, the substituents may be mutually connected to form a ring when the substituent is a group containing an alkyl chain, the alkyl chain may be interrupted by a group containing a hetero atom.

As the phenylene group, a group represented by following formula (5) or formula (6) is preferable.

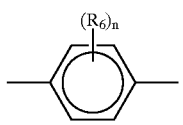

(5)

$R_6$ represents an alkyl group, alkoxy group, alkylthio group, alkyl silyl group, aryloxy group, aryl silyl group, arylalkyl group, arylalkoxy group, arylalkyl silyl group, arylalkenyl group, arylalkynyl group, monovalent heterocyclic compound group, or cyano group, preferably alkyl group, alkoxy group, alkylthio group, aryloxy group, arylalkyl group, arylalkoxy group, more preferably alkyl group, alkoxy group, alkylthio group, aryloxy group, arylalkoxy group, and especially preferably alkoxy group; n represents an integer of 0 to 4; when n is two or more, a plurality of $R_6$s may be mutually the same or different.

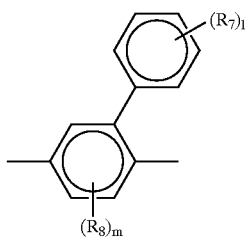

(6)

$R_7$ and $R_8$ each independently represent the same as those of $R_1$; l represents an integer of 0 to 5; m represents an integer of 0 to 3; when l is two or more, a plurality of $R_7$s may be mutually the same or different; when m is two or more, a plurality of $R_8$s may be mutually the same or different.

As $R_7$ and $R_8$, an alkyl group, alkoxy group, alkylthio group, aryl group, aryloxy group, aryl alkyl group, and aryl alkoxy group are preferable; an alkyl group, alkoxy group, alkylthio group, aryloxy group, and arylalkoxy group are more preferable; and alkoxy group is especially preferable. In formula (5), n represents an integer of 0 to 4.

In view of solubility, n is preferably at least 1, and in view of synthesis, n is preferably 1–2.

In formula (6), l represents an integer of 0 to 5 and m represents an integer of 0 to 3. In view of synthesis, l and m are preferably 0 to 2.

Stilbene-diyl group may have a substituent, and as the substituent, the same groups as the substituent of the phenylene group mentioned above can be chosen.

As the stilbene-diyl group, a group represented by following formula (8) is preferable.

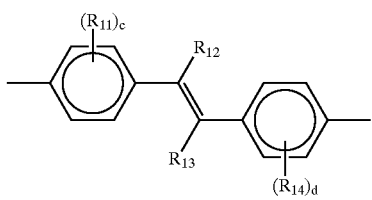

(8)

$R_{11}$ and $R_{14}$ represent the same as those of $R_1$; c and d each independently represent an integer of 0 to 4; when c is two or more, a plurality of $R_{11}$s may be mutually the same or different; when d is two or more, a plurality of $R_{14}$s may be mutually the same or different; $R_{12}$ and $R_{13}$ each independently represent a hydrogen atom, an alkyl group, aryl group, arylalkyl group, monovalent heterocyclic compound group, or cyano group.

As $R_{11}$ and $R_{14}$, an alkyl group, alkoxy group, alkylthio group, aryl group, aryloxy group, arylalkyl group, and aryl alkoxy group are preferable; alkyl group, alkoxy group, alkylthio group, aryloxy group, and aryl alkoxy group are more preferable; and alkoxy group, arylalkoxy group, and aryloxy group are further preferable.

In formula (8), $R_{12}$ and $R_{13}$ each independently represent a hydrogen atom, an alkyl group, aryl group, arylalkyl group, monovalent heterocyclic compound group, or cyano group.

As $R_{12}$ and $R_{13}$ in formula (8), a hydrogen atom, an alkyl group, aryl group, and cyano group are preferable, and a hydrogen atom and cyano group are more preferable. c and d each independently represent an integer of 0 to 4. In view of solubility, c and d are preferably 1 or more, and in view of synthesis, they are preferable 3 or less. Further preferably, c and d are 1 to 2.

The stilbene-diyl group is preferably a group represented by following formula (9).

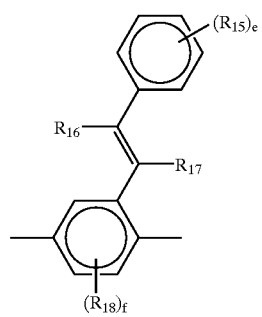

(9)

$R_{15}$ and $R_{18}$ each independently represent the same as those of $R_1$. e represents an integer of 0 to 5. f represents an integer of 0 to 3. When e is two or more, a plurality of $R_{15}$s may be mutually the same or different. When f is two or more, a plurality of $R_{18}$s may be mutually the same or different. $R_{16}$ and $R_{17}$ each independently represent a hydrogen atom, an alkyl group, aryl group, aryl alkyl group, monovalent heterocyclic compound group, or cyano group.

$R_{15}$ and $R_{18}$ are preferably an alkyl group, alkoxy group, alkylthio group, aryl group, aryloxy group, aryl amino group, arylalkyl group, arylalkoxy group, and cyano group; and more preferably, alkoxy group, aryl group, aryloxy group, arylamino group, arylalkoxy group, and cyano group.

e represents an integer of 0 to 5. In view of solubility, e is preferably 1 or more, and in view of synthesis, e is preferably 3 or less. Further preferably, e is 1 to 2. f represents an integer of 0 to 3. In view of solubility, f is preferably 1 or more, and in view of synthesis, f is preferably 3 or less. Further preferably, f is 0 to 2.

$R_{16}$ and $R_{17}$ each independently represent a hydrogen atom, an alkyl group, aryl group, arylalkyl group, monovalent heterocyclic compound group, or cyano group. $R_{16}$ and $R_{17}$ are preferably a hydrogen atom, an alkyl group, aryl group, and cyano group, and more preferably a hydrogen atom and cyano group.

Distilbene-diyl group is a group which has an arylene or a divalent heterocyclic compound group in the center, and two vinylene groups each respectively between a phenylene group and the above arylene or a divalent heterocyclic compound group. The arylene group may have one or more substituents. As the specific examples, exemplified are the same substituents as those of $Ar_1$, $Ar_2$ and $Ar_3$.

The distilbene-diyl group is preferably a group represented by following formula (12).

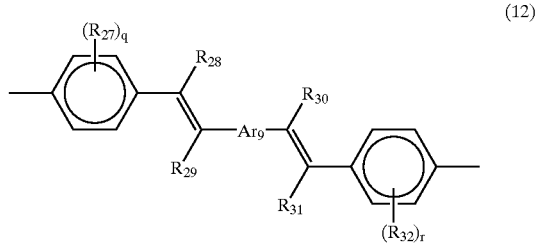

$Ar_9$ is an arylene group or a divalent heterocyclic compound group; $R_{27}$ and $R_{32}$ each independently represent the same as those of $R_1$; q and r each independently represent an integer of 0 to 4; when q is two or more, a plurality of $R_{27}$s may be mutually the same or different; when r is two or more, a plurality of $R_{32}$s may be mutually the same or different; and $R_{28}$–$R_{31}$ each independently represent a hydrogen atom, an alkyl group, aryl group, aryl alkyl group, monovalent heterocyclic compound group, or cyano group.

$Ar_9$ in formula (12) is an arylene group or a divalent heterocyclic compound group. Specific examples of such groups is the same as the above examples of $Ar_1$–$Ar_3$. In formula (12), $R_{27}$ and $R_{32}$ each independently represent the same as those of $R_1$. $R_{27}$ and $R_{32}$ are preferably an alkyl group, alkoxy group, alkylthio group, aryl group, aryloxy group, arylalkyl group, and arylalkoxy group, more preferably an alkyl group, alkoxy group, alkylthio group, aryloxy group, and arylalkoxy group, and further preferably, alkoxy group, aryl alkoxy group, and aryloxy group.

In formula (12), q and r each independently represent an integer of 0 to 4, and preferably 3 or less in view of synthesis. Further preferably, q and r are 0 to 2. When q is two or more, a plurality of $R_{27}$s may be mutually the same or different. When r is two or more, a plurality of $R_{32}$s may be mutually the same or different.

In formula (12), $R_{28}$–$R_{31}$ each independently represent a hydrogen atom, an alkyl group, aryl group, arylalkyl group, monovalent heterocyclic compound group, or cyano group. Specific examples of these substituents are the same as those of $R_1$. As $R_{28}$–$R_{31}$, a hydrogen atom, an alkyl group, aryl group, and cyano group are preferable, and a hydrogen atom and cyano group are more preferable.

As the fluorene-diyl groups, a group represented by following formula (13) is preferable.

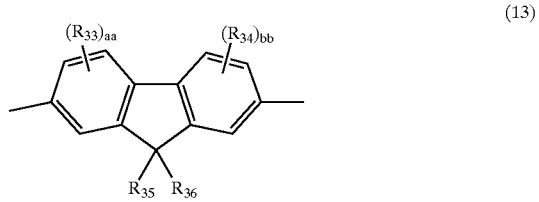

$R_{33}$, and $R_{34}$, $R_{35}$ and $R_{36}$ each independently represent the same as those of $R_1$. aa and bb each independently represent an integer of 0 to 4.

As $R_{33}$, $R_{34}$, $R_{35}$, and $R_{36}$, an alkyl group, alkoxy group, alkylthio group, aryl group, aryloxy group, arylalkyl group, and arylalkoxy group are preferable; an alkyl group, alkoxy group, alkylthio group, aryloxy group, and aryl alkoxy group are more preferable; and an alkyl group, alkoxy group, aryloxy group, and aryl alkoxy group are further preferable.

In formula (13), aa and bb each independently represent an integer of 0 to 3. In view of synthesis, aa and bb are preferably 2 or less. More preferably, aa and bb are 0. When aa is two or more, a plurality of $R_{33}$s may be mutually the same or different. When bb is two or more, a plurality of $R_{34}$s may be mutually the same or different.

The divalent condensed polycyclic aromatic compound group is an atomic group in which two hydrogen atoms are removed from a condensed polycyclic aromatic compound. The number of carbon atoms contained in the ring of the condensed polycyclic aromatic compound represented by $Ar_6$ is usually about 6–60. An aromatic compound in which 2 to 5 benzene rings are condensed is preferable. Concretely, naphthalene, anthracene, phenanthrene, pyrene, perylene, naphthacene, pentacene, chrysene, coronene, etc. are exemplified, and naphthalene and anthracene are preferable. In view of solubility, it is preferable to have at least one substituent.

As the divalent condensed polycyclic aromatic compound groups, a group represented by following formula (7) is preferable.

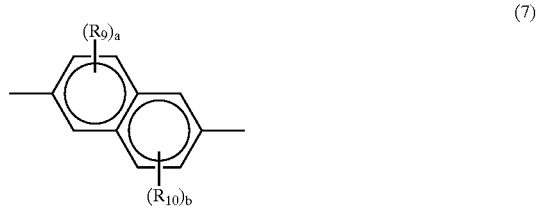

$R_9$ and $R_{10}$ each independently represent the same as those of $R_1$. a and b represent an integer of 0 to 3 each independently. When a is two or more, a plurality of $R_9$s may be mutually the same or different. When b is two or more, a plurality of $R_{10}$s may be mutually the same or different.

As $R_9$ and $R_{10}$, an alkyl group, alkoxy group, alkylthio group, aryl group, aryloxy group, arylalkyl group, and aryl alkoxy group are preferable; an alkyl group, alkoxy group, alkylthio group, aryloxy group, and aryl alkoxy group are more preferable; and alkoxy group, aryloxy group, and aryl alkoxy group are further preferable.

In formula (7), in view of solubility, it is preferable that either one of a and b is not 0, and more preferably a and b are each independently 1 to 2.

The divalent condensed polycyclic hetero-ring compound group is an atomic group in which two hydrogen atoms are removed from a condensed polycyclic hetero-ring compound. The condensed polycyclic hetero-ring compound represented by $Ar_6$ means an organic compound having a cyclic structure where two or more rings are condensed, and a hetero atom, such as oxygen, sulfur, nitrogen, phosphorus, boron, arsenic, silicon, etc., is contained in the cyclic structure as the element other than carbon atoms. The number of carbon atoms contained in the ring is preferably about 6 to 60, more preferably 6 to 30. Concretely, quinoline, quinoxaline, acridine, phenanthroline, benzoxazole, benzothiazole, benzoxathiazole, benzo thiadiazole, dibenzofuran, dibenzo thiophene, carbazole, etc. are exemplified; and quinoline, benzoxathiazole, benzo thiadiazole, and carbazole are preferable. In view of solubility, it is preferable to have at least one substituent.

As the divalent monocyclic hetero-ring groups, a group represented by following formula (11) is preferable.

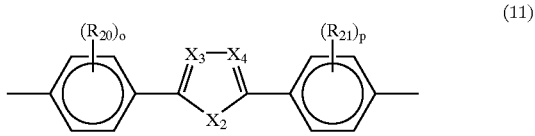

(11)

$R_{20}$ and $R_{21}$ each independently represent the same as those of $R_1$. o and p each independently represent an integer of 0 to 4. When o is two or more, a plurality of $R_{20}$s may be mutually the same or different. When p is two or more, a plurality of $R_{21}$s may be mutually the same or different. $X_2$ represents a group represented by O, S, N—$R_{22}$, or $SiR_{23}R_{24}$. $X_3$ and $X_4$ each independently represent a group represented by N or C—$R_{25}$. $R_{22}$–$R_{25}$ each independently represent a hydrogen atom, an alkyl group, aryl group, aryl alkyl group, or monovalent heterocyclic compound group.

$R_{20}$ and $R_{21}$ preferably represent an alkyl group, alkoxy group, aryl group, aryloxy group, arylalkyl group, arylalkoxy group, and cyano group, more preferably alkoxy group, aryloxy group, arylalkoxy group, and cyano group.

In formula (11), o and p each independently represent an integer of 0 to 4. In view of synthesis, o and p are, each independently, preferably 3 or less, and more preferably 0 to 2.

$R_{22}$–$R_{25}$ each independently represent a hydrogen atom, an alkyl group having 1 to 20 carbon atoms, aryl group having 6 to 60 carbon atoms, arylalkyl group having 7 to 60 carbon atoms, or monovalent heterocyclic compound group having 4 to 60 carbon atoms. $R_{23}$ and $R_{24}$ are suitably aryl groups.

Examples of the 5 membered ring in the center of the repeating unit represented by formula (11) include oxadiazole, triazole, thiophene, furan, silole, etc.

As the divalent condensed polycyclic hetero-ring compound groups, a group represented by following formula (10) is preferable.

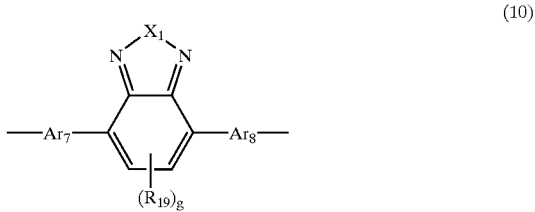

(10)

$Ar_7$ and $Ar_8$ each independently represent an arylene group which may have a substituent, or a divalent heterocyclic compound group. $R_{19}$ represents the same as those of $R_1$. g represents an integer of 0 to 2. When g is two or more, a plurality of $R_{19}$s may be mutually the same or different. $X_1$ is selected from O or S.

$R_{19}$ is preferably an alkyl group, alkoxy group, aryl group, aryloxy group, arylalkyl group, arylalkoxy group, and cyano group; more preferably an alkyl group, aryl group, aryl alkyl group, and cyano group.

In formula (10), $X_1$ is preferably S.

$Ar_7$ and $Ar_8$ of formula (10) are, for example, phenylene group, thienylene group, naphthalene diyl group, etc. As the structure including $Ar_7$ and $Ar_8$, more specifically, the following structures are exemplified.

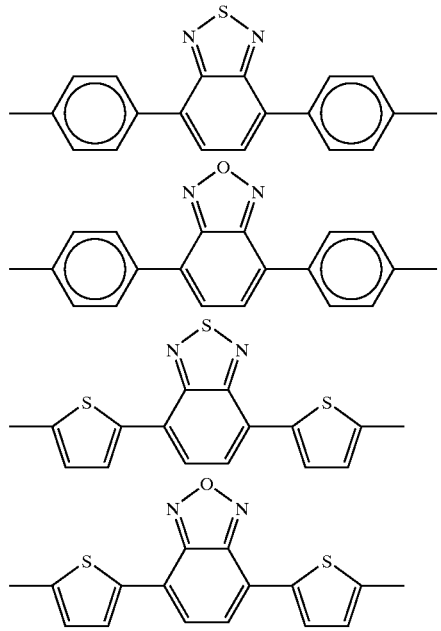

The divalent aromatic amine compound group is an atomic group in which two hydrogen atoms are removed from an amine compound substituted with 2 or more of aryl groups. As the aryl group, phenyl group, naphtyl group, anthryl group, phenanthrenyl group, etc. are exemplified.

As the divalent aromatic amine compound group, a group represented by following formula (14) is preferable.

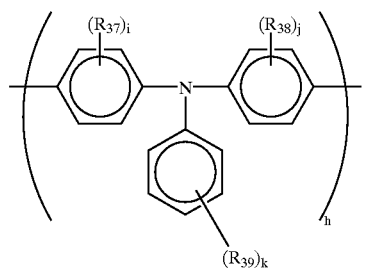

(14)

$R_{37}$, $R_{38}$ and $R_{39}$ each independently represent the same as those of $R_1$. i and j each independently represent an integer of 0 to 4. k represents an integer of 0 to 5. h represents 1 or 2. When i is two or more, a plurality of $R_{37}$s may be mutually the same or different. When j is two or more, a plurality of $R_{38}$s may be mutually the same or different. When k is two or more, a plurality of $R_{39}$s may be mutually the same or different.

As $R_{37}$, $R_{38}$ and $R_{39}$, an alkyl group, alkoxy group, alkylthio group, aryl group, aryloxy group, arylalkyl group, and arylalkoxy group are preferable; an alkyl group, alkoxy group, alkylthio group, aryloxy group, and arylalkoxy group are more preferable; and an alkyl group and alkoxy group are further preferable.

In formula (14), i and j each independently represent an integer of 0 to 4, preferably 0–2. k represents an integer of 0 to 5, preferably 0–2, and more preferably 1. As a substituting position of $R_{39}$, in view of synthesis, the p-position to N atom is preferable. Two benzene rings adjacent to one N may be connected with a carbon-carbon single bond to form a carbazole ring. In this case, the carbazole ring produced by connection preferably have a structure contained in the main chain, in view of synthesis.

As the divalent aromatic amine compound groups, a group represented by following formula (15) is preferable.

(15)

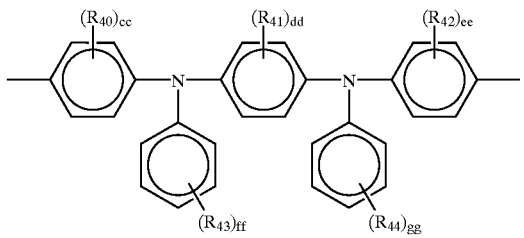

$R_{40}$–$R_{44}$ each independently represent the same as those of $R_1$. cc, dd, and ee each independently represent an integer of 0 to 4. When cc is two or more, a plurality of $R_{40}$s may be mutually the same or different. When dd is two or more, a plurality of $R_{41}$s may be mutually the same or different. When ee is two or more, a plurality of $R_{42}$s may be mutually the same or different. ff and gg each independently represent an integer of 0 to 5. When ff is two or more, a plurality of $R_{43}$s may be mutually the same or different. When gg is two or more, a plurality of $R_{44}$s may be mutually the same or different.

As $R_{40}$–$R_{44}$, an alkyl group, alkoxy group, alkylthio group, aryl group, aryloxy group, arylalkyl group, and arylalkoxy group are preferable; an alkyl group, alkoxy group, alkylthio group, aryloxy group, and arylalkoxy group are more preferable; and an alkyl group and alkoxy group are further preferable.

In formula (15), cc, dd, and ee each independently represent an integer of 0 to 4, preferably 0–2. ff and gg represent an integer of 0 to 5, preferably 0–2, and further preferably 1. As the substituting position of $R_{43}$ and $R_{44}$, the p-position to N atom is preferable, in view of synthesis. Two benzene rings adjacent to one N may be connected by the carbon-carbon single bond to form a carbazole ring.

Those comprising a repeating unit represented by the above formula (1) and at least one repeating unit represented by above formulas (5)–(15) are also the embodiments of the present invention.

In the repeating unit of the polymer compound of the present invention, when the aromatic compound group, heterocyclic compound group, or vinylene group has substituent, adjacent substituents may be connected to form a ring.

When the substituent contains an alkyl chain, the alkyl chain may be interrupted by the group containing a hetero atom.

Furthermore, the end group of polymer compound may also be protected with a stable group since if a polymerization active group remains intact, there is a possibility of reduction in light emitting property and life-time when the fluorescent substance is made into an device. Those having a conjugated bond continuing to a conjugated structure of the main chain are preferable, and there are exemplified structures connected to an aryl group or heterocyclic compound group via a carbon-carbon bond. Specifically, substituents of the chemical formula 10 in JP-A No. 9-45478 are exemplified.

Moreover, the polymer compound may contain a repeating unit other than repeating units represented by formulas (1)–(15), in an amount which does not deteriorate fluorescent property and charge transporting property. Further, repeating units represented by formulas (1)–(15) and other repeating units may be connected with a non-conjugation unit, or such a non-conjugation part may be contained in the repeating unit. As the bonding structure, there are exemplified those illustrated below, those obtained by combining those illustrated below with a vinylene group, those obtained by combining two or more of those illustrated below, and the like. Here, R represents the same groups as above $R_1$, and Ar represents a hydrocarbon group having 6 to 60 carbon atoms.

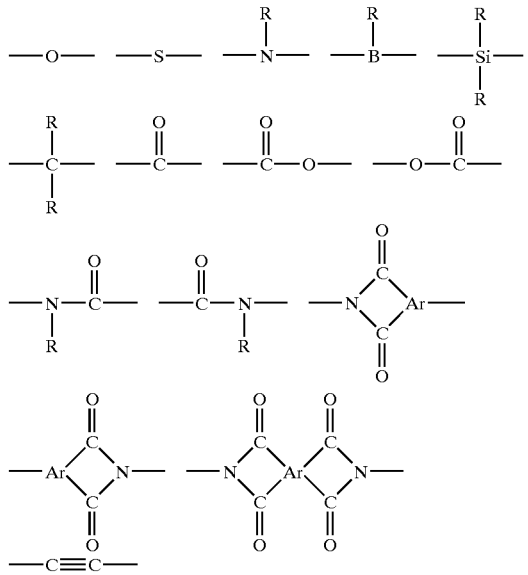

The polymer compound may also be a random, block or graft copolymer, or a polymer having an intermediate structure thereof, for example, a random copolymer having block property. From the viewpoint for obtaining a polymer compound having high fluorescent quantum yield, random copolymers having block property and block or graft copolymers are more preferable than complete random copolymers. Further, the polymer compound may have a branched main chain and more than three terminals. Moreover, the polymer compound may be a regularly grown dendrimer or may have a structure having random branching.

Further, since the light emission from a thin film is utilized, polymer compounds exhibiting fluorescence in the solid state are suitably used.

As good solvents for the polymer compound, there are exemplified chloroform, methylene chloride, dichloroethane, tetrahydrofuran, toluene, xylene, mesitylene, tetralin, decalin, n-butylbenzene and the like. The polymer compound can be usually dissolved in these solvents in an amount of 0.1 wt % or more, though the amount differs depending on the structure and molecular weight of the polymer compound.

The polymer compound has a polystyrene reduced number average molecular weight of $10^3$–$10^8$, more preferably $10^4$–$10^7$, and more preferably $2\times10^4$–$10^6$.

When these polymer compounds are used as a light emitting material of a polymer LED, the purity thereof exerts an influence on light emitting property, therefore, it is preferable that a monomer is purified by a method such as distillation, sublimation purification, re-crystallization and the like before being polymerized and further, it is preferable to conduct a purification treatment such as re-precipitation purification, chromatographic separation and the like after the synthesis.

The polymer compound of the present invention can be used not only as a light emitting material, but also as an organic semiconductor material, optical material, or as conductive material by doping.

A method of producing a polymer compound of the present invention will be described below.

As the method of producing a polymer compound of the present invention, for example, a method described in JP-A No. 5-202355 is mentioned, when a vinylene group is contained in the main chain. Namely, there are exemplified methods such as polymerization of a compound having an aldehyde group with a compound having a phosphonium salt group, or of a compound having an aldehyde group and a phosphonium salt group, according to a Wittig reaction, polymerization of a compound having a vinyl group with a compound having a halogen group, or of a compound having a vinyl group and a halogen group, according to a Heck reaction, polymerization of a compound having an aldehyde group with a compound having an alkylphosphonate group, or of a compound having an aldehyde group and an alkylphosphonate group, according to a Horner-Wadsworth-Emmons reaction, polycondensation of a compound having two or more halogenated methyl groups, according to a de-hydrohalogenating method, polycondensation of a compound having two or more sulfonium salt groups, according to a sulfonium salt-decomposing method, polymerization of a compound having an aldehyde group with a compound having an acetonitrile group, or of a compound having an aldehyde group and an acetonitrile group, according to a Knoevenagel reaction, polymerization of a compound having two or more aldehyde groups, according to McMurry reaction, and the like.

When a vinylene group is not contained in the main chain, for example, a method of polymerization from corresponding monomers by a Suzuki coupling reaction, a method of polymerization by a Grignard reaction, a method of polymerization using a Ni(0) catalyst, a method of polymerization using an oxidizer such as $FeCl_3$ and the like, a method of oxidation polymerization electrochemically, a method of decomposition of an intermediate polymer having a suitable releasing group, and the like are exemplified.

Of these, the polymerization method by a Wittig reaction, the polymerization method by a Heck reaction, the polymerization method by a Horner-Wadsworth-Emmons method, the polymerization method by a Knoevenagel reaction, the polymerization method by a Suzuki coupling reaction, the polymerization method by a Grignard reaction and the polymerization method using a Ni(0) catalyst are preferable since structure control is easy in these methods.

Specifically, a compound used as a monomer, having a plurality of reactive substituents is dissolved, if necessary, in an organic solvent, and can be reacted at the melting temperature or more and the boiling point or less of the organic solvent using an alkali or suitable catalyst, for example. For example, known methods can be used, described in "Organic Reactions", vol. 14, pp. 270 to 490, John Wiley & Sons, Inc., 1965, "Organic Reactions", vol. 27, pp. 345 to 390, John Wiley & Sons, Inc., 1982, "Organic Synthesis", Collective Volume VI, pp. 407 to 411, John Wiley & Sons, Inc., 1988, Chemical Review, vol. 95, p. 2457 (1995), Journal of Organometallic Chemistry, vol. 576, p. 147 (1999), Journal of Praktical Chemistry, vol. 336, p. 247 (1994), Makromolecular Chemistry Macromolecular Symposium, vol. 12, p. 229 (1987), and the like.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise (however, this is not applicable in the case of a reaction in a two-phase system with water, such as a Suzuki coupling reaction).

For the reaction, an alkali or suitable catalyst is added appropriately. These may be selected according to the reaction used. It is preferable that the alkali or catalyst is soluble sufficiently in a solvent used for the reaction. As the method of mixing an alkali or catalyst, there is exemplified a method of adding a solution of an alkali or catalyst slowly while stirring under an inner atmosphere of argon and nitrogen and the like or a method of slowly adding the reaction solution to a solution of an alkali or catalyst, inversely.

More specifically, regarding the reaction conditions, in the cases of a Wittig reaction, Horner reaction, Knoevengel reaction and the like, an alkali in an amount of equivalent or more, preferably from 1 to 3 equivalent of based on the amount of functional groups of monomers is used and reacted. The alkali is not particularly restricted, and for example, metal alkolates such as potassium-t-butoxide, sodium-t-butoxide, sodium ethylate, lithium methylate and the like, hydride reagents such as sodium hydride and the like, amides such as sodiumamide and the like can be used. As the solvent, N,N-dimethylformamide, tetrahydrofuran, dioxane, toluene and the like are used. The reaction can be progressed at a reaction temperature of usually from room temperature to about 150° C. The reaction time is, for example, from 5 minutes to 40 hours, and time for sufficient progress of polymerization may be permissible, and since there is no necessity of leaving for a long period of time after completion of the reaction, the reaction time is preferably from 10 minutes to 24 hours. The concentration in the reaction may advantageously be selected appropriately within the range from about 0.01 wt % to the maximum solution concentration since when the concentration is too low, the reaction efficiency is poor and when too high, the reaction control is difficult, and the usual range is from 0.1 wt % to 20 wt %. In the case of a Heck reaction, monomers are reacted in the presence of a base such as triethylamine and the like, using a palladium catalyst. The reaction is effected at a reaction temperature of from about 80 to 160° C. for a reaction time of about 1 to 100 hours, using a solvent having relatively high boiling point such as N,N-dimethylformamide, N-methylpyrrolidone and the like.

In the case of a Suzuki coupling reaction, palladium [tetrakis(triphenylphosphine)], palladium acetates and the like are used, for example, as a catalyst, and an inorganic base such as potassium carbonate, sodium carbonate, barium hydroxide and the like, an organic base such as triethylamine and the like, and an inorganic salt such as cesium fluoride and the like, are added preferably in equivalent amount, preferably in an amount of 1 to 10 equivalent based on monomers, and reacted. It may be also permissible that an inorganic salt is used as an aqueous solution and reacted in a two-phase system. As the solvent, N,N-dimethylformamide, toluene, dimethoxyethane, tetrahydrofuran and the like are exemplified. Depending on the solvent, temperatures of 50 to 160° C. are preferably used. It may also be permissible that the temperature is raised near the boiling point of a solvent, to cause reflux. The reaction time is from about 1 to 200 hours.

In the case of a Grignard reaction, exemplified is a method in which a halide and metal Mg are reacted in an ether-based solvent such as tetrahydrofuran, diethyl ether, dimethoxyethane and the like to prepare a Grignard reagent which is mixed with a separately prepared monomer solution, and a nickel or palladium catalyst is added while paying attention to excess reaction, then, the reaction temperature is raised to reflux and the reaction is effected. The Grignard reagent is used in the equivalent amount, preferably in an amount of from 1 to 1.5 equivalent, more preferably from 1 to 1.2 equivalent, based on monomers. Also in the case of polymerization by other methods than those described above, the reaction can be effected by known methods.

Next, the polymer LED of the present invention will be described. Regarding the structure of the polymer LED of the present invention, a light-emitting layer is present between an anode and a cathode at least one of which is transparent or semi-transparent, and the polymer compound of the present invention is contained in the light-emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

Moreover, as the polymer LED of the present invention, there are exemplified: a device having a layer containing a conducting polymer disposed between at least one of the electrodes and the light emitting layer, adjacently to said electrode; and a device having an insulating layer having a thickness of 2 nm or less disposed between at least one of the electrodes and a light emitting layer, adjacently to said electrode.

For example, the following structures a) to d) are specifically exemplified.

a) anode/light emitting layer/cathode
b) anode/hole transporting layer/light emitting layer/cathode
c) anode/light emitting layer/electron transporting layer//cathode
d) anode/hole transporting layer/light emitting layer/electron transporting layer/cathode ("/" indicates the layers are adjacently laminated.)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer. The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified: layers containing an conducting polymer; layers which are disposed between an anode and a hole transporting layer and contain a material having an ionization potential between the ionization potential of an anode material and the ionization potential of a hole transporting material contained in the hole transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymer compound soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 μm, preferably from 2 nm to 500 nm, further preferably from 5 nm to 200 nm.

In the polymer LED of the present invention, light emitting materials other than the above-described polymer compound can also be mixed in a light emitting layer. Further, in the polymer LED of the present invention, the light emitting layer containing light emitting materials other than the above-described polymer compound may also be laminated with a light emitting layer containing the above-described polymer compound.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

The light emitting layer contains the polymer compound of the present invention, and may be mixed with a known polymer or a known low molecular weight charge transporting material. As the charge transporting material, those materials used for the following positive hole transportating layer and electron transporting layer may be used. Moreover, organic materials or inorganic materials having neither light emitting nor charge transporting property may be mixed in the light emitting layer, within a range of not injuring the light emitting property.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

At the time of film forming from a solution or a molten state, a polymer binder can be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be suitably used as a flat light source, segment display apparatus, dot-matrix display apparatus, and back light of a liquid crystal display.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymer compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Here, as the number-average molecular weight, a polystyrene reduced average molecular weight was obtained by gel permeation chromatography (GPC) using chloroform as a solvent.

Example 1
<Synthesis of N,N-bis(4-bromo phenyl)-N',N'-diphenyl-1,4-phenylenediamine>

Palladium-acetate (0.09 g, 0.4 mmols), tris(2-methylphenyl) phosphine (0.268 g, 0.85 mmols) and toluene 20 ml were put into a reaction container, and stirred for 30 minutes at a room temperature. When the mixture turned into a uniform yellow solution, tris(4-bromophenyl)amine (9. 64 g, 20 mmol), sodium t-butoxide (2.75 g, 28 mmol), and toluene 70 ml were added and heated. When reflux started, diphenylamine (3.32 g, 19.6 mmols) dissolved in toluene 50 ml was added dropwise. After the dropwise addition, it was refluxed with heating for 9 hours. After cooling to a room temperature, it was treated with hydrochloric acid, extracted with toluene and dried. Toluene was distilled off, and deep brown oil was obtained. By purifying this with a silica gel column using toluene:cyclohexane=1:10 mixed solvent as the eluent, white solid (3.16 g, 28%) was obtained.

<Manufacture of Polymer Compound 1>

After dissolving N,N-bis(4-bromophenyl)-N',N'-diphenyl-1,4-phenylenediamine 0.64 g, 2,7-dibromo-9,9-dioctylfluorene 1.44 g, and 2,2'-bipyridyl 1.38 g in tetrahydrofuran (dehydrated) 100 ml, the inside of the system was replaced with nitrogen gas by bubbling with nitrogen gas. To this solution, bis(1,5-cyclooctadiene)nickel(0) 2.5 g was added, and after stirring for about 10 minutes at a room temperature, the temperature was raised and reacted at 60° C. for 3 hours.

After cooling the reaction liquid, a mixed solution of methanol 150 ml/ion-exchanged water 150 ml was added, and stirred for about 1 hour. After allowing the solution to stand overnight at a room temperature, resulting precipitate was collected by filtration. Next, the precipitate was dried and dissolved in toluene. After removing insoluble matters by filtration, it was purified with using a silica gel/alumina column. Reprecipitation purification was carried out by pouring the toluene solution into methanol. The resulting precipitate was collected and dried under reduced pressure, and a polymer 0.8 g was obtained. The resulting polymer is referred to as polymer compound 1.

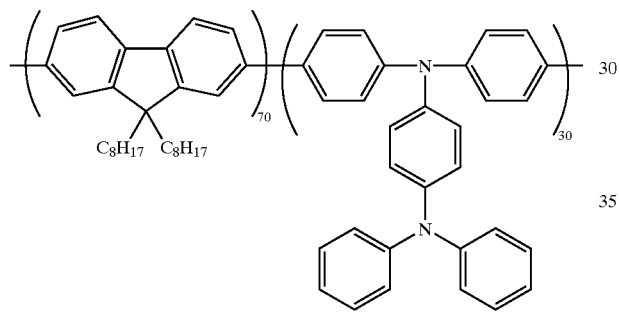

The polystyrene reduced number average molecular weight of polymer compound 1 is $3.7 \times 10^4$.

The structure included in polymer compound 1 presumed from charged materials is shown below.

Example 2

<Synthesis of N,N-bis(4-bromo phenyl)-N'-(3-methylphenyl)-N'-phenyl benzidine>

Bis(4-bromo phenyl)amine (1.29 g, 3.9 mmols), N-(4'-iodo biphenyl-4-yl)-N-(m-tolyl)aniline (2.0 g, 4.3 mmols), 1,10-phenanthroline (0.052 g, 0.29 mmols), copper-chloride (I) (0.028 g, 0.29 mmols), potassium hydroxide (1.71 g, 30.4 mmols), and toluene 10 ml were put into a light-shielded reaction container, placed into an oil bath, and refluxed with heating at 125° C. for 12 hours. Cooling to a room temperature, the mixture was separated using toluene and water, and the organic layer was dried by sodium sulfate. After concentrating the organic layer to 200 ml, cerite and activated alumina were added, and stirred at 75° C. for 2 hours for decoloration. By silica gel column using toluene:cyclohexane=1:5 mixed solvent as the eluent, yellowish transparent vitrified solid (2.38 g, 50%) was obtained.

<Manufacture of Polymer Compound 2>

After dissolving N,N-bis(4-bromophenyl)-N'-(3-methylphenyl)-N'-phenyl benzidine 0.30 g and 2,7-dibromo-9,9-dioctyl fluorene 0.59 g, and 2,2'-bipyridyl 0.55 g in tetrahydrofuran (dehydrated) 40 ml, the inside of the system was replaced with nitrogen gas by bubbling with nitrogen gas. To this solution, bis(1,5-cyclooctadiene)nickel (0) 0.97 g was added, and after stirring for about 10 minutes at a room temperature, the temperature was raised and reacted at 60° C. for 3 hours.

After cooling the reaction liquid, a mixed solution of methanol 50 ml/ion-exchanged water 50 ml was added, and stirred for about 1 hour. The resulting precipitate was collected by filtration. Next, the precipitate was dried and dissolved in toluene. After removing insoluble matters by filtration, it was purified with using an alumina column. Reprecipitation purification was carried out by pouring the toluene solution into methanol. The resulting precipitate was collected and dried under reduced pressure, and a polymer 0.35 g was obtained. The resulting polymer is referred to as polymer compound 2.

The polystyrene reduced number average molecular weight of polymer compound 2 is $4.3 \times 10^4$.

The structure included in polymer compound 2 presumed from charged materials is shown below.

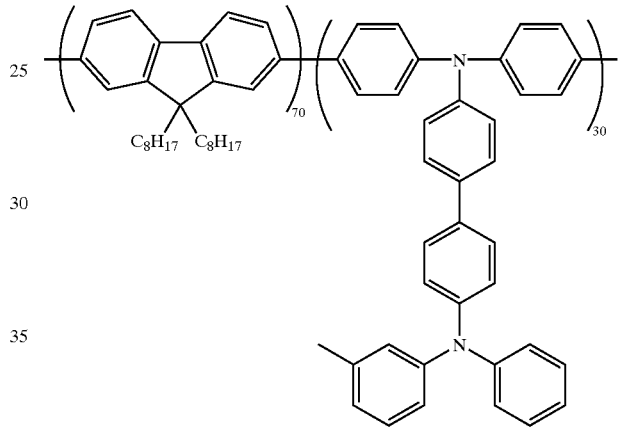

Example 3

<Synthesis of N,N-bis(4-bromobiphenyl)-N',N'-bis(4-butylphenyl)-1,4-phenylenediamine>

Under inert atmosphere, tris(dibenzylidene acetone) dipalladium 0.24 g (0.27 mmol), diphenylphosphinoferrocene 0.22 g (0.4 mmol), sodium tertiary butoxide 2.56 g (26.7 mmol), and toluene 125 mL were put into a 300 mL three-necked flask, and stirred at a room temperature for 30 minutes. Then, tris-(4-bromophenyl) amine 12.9 g (26.7 mmol) was added and stirred at a room temperature for 10 minutes.

Then, bis(4-butylphenyl) amine 5 g (17.8 mmol) was added, and the mixture was heated to 125° C. and refluxed for 9 hours. After the reaction, the reaction liquid was filtrated to remove insoluble matters, and purified by a short column of silica gel, and further by a silica gel column with using cyclohexane as an eluent. White powder was obtained (2.96 g, 24%).

<Manufacture of Polymer Compound 3>

After dissolving N,N-bis(4-bromobiphenyl)-N',N'-bis(4-butylphenyl)-1,4-phenylenediamine 0.21 g, 2,7-dibromo-9,9-dioctylfluorene 0.38 g, and 2,2'-bipyridyl 390 mg in tetrahydrofuran (dehydrated) 100 ml, bis(1,5-cyclooctadiene)nickel(0) 2.5 g was added to this solution, and the temperature was raised and reacted at 60° C. for 3 hours. After the reaction, the reaction liquid was cooled, and added dropwise into a mixed solution of 25% aqueous-ammonia 10 ml/methanol 120 ml/ion-exchanged water 50 ml, and stirred for about 1 hour. The resulting precipitate was collected by filtration and dried under reduced pressure for 2 hours, and then dissolved in toluene 50 mL. 30 ml of 1N hydrochloric acid was added to this solution, and stirred at a room temperature for 3 hours. After removing an aqueous layer, 30 ml of 4% aqueous ammonia was added, and stirred at a room temperature for 3 hours, and the aqueous layer was removed. Reprecipitation was carried out by adding the remaining toluene solution dropwise into methanol 150 ml, and the insoluble matters were removed by filtration. Then, it was dissolved in toluene again and purified through an alumina column (10 g of activated alumina). The recovered toluene solution was added dropwise into methanol 200 ml, and stirred for 30 minutes, and the deposited presipitates were filtrated and dried under reduced pressure for 2 hours. Yield of the resulting polymer was 300 mg. This polymer is referred to as polymer compound 3.

The polystyrene reduced number average molecular weight of polymer compound 3 is $4.8 \times 10^4$.

The structure included in polymer compound 3 presumed from charged materials is shown below.

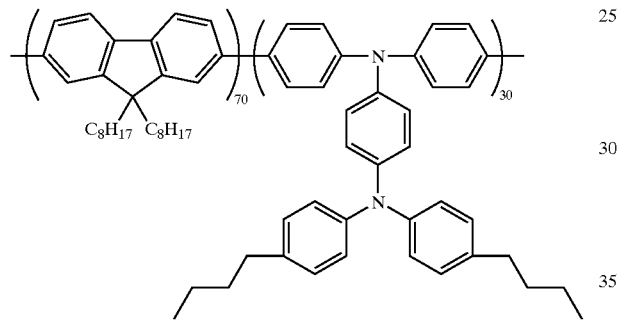

Example 4

<Synthesis of N,N-bis(4-bromobiphenyl)-N',N'-bis(4-methylphenyl)-1,4-phenylenediamine>

Under inert atmosphere, tris(dibenzylidene acetone) dipalladium 0.35 g (0.38 mmol), diphenylphosphinoferrocene 0.32 g (0.57 mmol), sodium tertiary butoxide 7.31 g (76 mmol), and toluene 178 mL were put into a 500 mL three-necked flask, and stirred at a room temperature for 30 minutes. Then, tris-(4-bromophenyl) amine 12.2 g (25.3 mmol) was added and stirred at a room temperature for 10 minutes.

Then, p-tolyl diphenylamine 5 g (17.8 mmol) was added, and the mixture was heated to 125° C. and refluxed for 9 hours. After the reaction, the reaction liquid was filtrated to remove insoluble matters, and purified by a short column of silica gel, and further by a silica gel column with using cyclohexane as an eluent. White powder was obtained (1.20 g, 8%).

<Manufacture of Polymer Compound 4>

After dissolving N,N-bis(4-bromobiphenyl)-N',N'-bis(4-methylphenyl)-1,4-phenylenediamine 0.18 g, 2,7-dibromo-9,9-dioctylfluorene 0.38 g, and 2,2'-bipyridyl 390 mg in tetrahydrofuran (dehydrated) 28 ml, bis(1,5-cyclooctadiene) nickel(0) 690 mg was added to this solution, and the temperature was raised and reacted at 60° C. for 3 hours. After the reaction, the reaction liquid was cooled, and added dropwise into a mixed solution of 25% aqueous-ammonia 10 ml/methanol 120 ml/ion-exchanged water 50 ml, and stirred for about 1 hour. The resulting precipitate was collected by filtration and dried under reduced pressure for 2 hours, and then dissolved in toluene 50 mL. 30 ml of 1N hydrochloric acid was added to this solution, and stirred at a room temperature for 3 hours. After removing an aqueous layer, 30 ml of 4% aqueous ammonia was added, and stirred at a room temperature for 3 hours, and the aqueous layer was removed. Reprecipitation was carried out by adding the remaining toluene solution dropwise into methanol 150 ml, and the insoluble matters were removed by filtration. Then, it was dissolved in toluene again and purified through an alumina column (10 g of activated alumina). The recovered toluene solution was added dropwise into methanol 200 ml, and stirred for 30 minutes, and the deposited presipitates were filtrated and dried under reduced pressure for 2 hours. Yield of the resulting polymer was 270 mg. This polymer is referred to as polymer compound 4.

The polystyrene reduced number average molecular weight of polymer compound 4 is $5.1 \times 10^4$.

The structure included in polymer compound 4 presumed from charged materials is shown below.

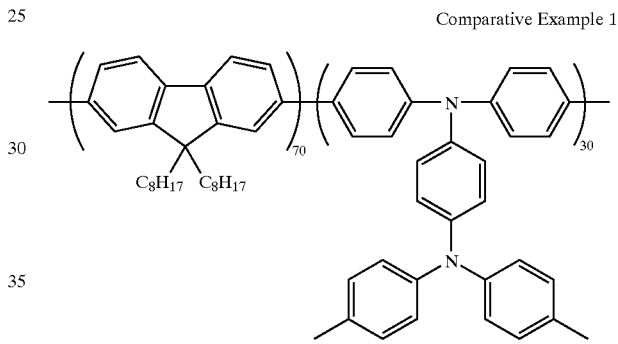

Comparative Example 1

COMPARATIVE EXAMPLE 1

<Synthesis of Polymer Compound 5>

2,7-dibromo-9,9-dioctylfluorene 0.82 g and 2,2'-bipyridyl 0.56 g was charged into a reaction container, and the inside of the reaction system was replaced with argon. To this, tetrahydrofuran (THF) (dehydrated) 15 ml which was deaired by argon gas bubbling was added. Next, to this mixed solution, bis(1,5-cyclooctadiene)nickel(0) 0.96 g was added, and after stirring for about 10 minutes at a room temperature, it was reacted at 60° C. for 8 hours. The reaction was conducted under an argon gas atmosphere. After the reaction, the solution was cooled, and poured into a mixed solution of 25% aqueous-ammonia 10 ml/ethanol 50 ml/ion-exchanged water 50 ml, and stirred for about 1 hour. Then, the resulting precipitate was collected by filtration. The precipitate was dried and dissolved in chloroform. After removing insoluble matters by filtration, reprecipitation was carried out by pouring it into methanol. The resulting precipitate was dried under reduced pressure, and a polymer 0.35 g was obtained. The resulting polymer is referred to as polymer compound 3.

The polystyrene reduced number average molecular weight of polymer compound 3 is $1.5 \times 10^5$.

The structure of the repeating unit included in polymer compound 3 is shown below.

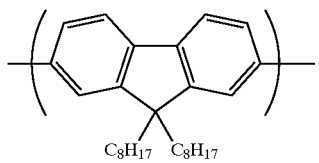

Example 5

<Evaluation of Ionization Potential>

Ionization potential was determined from the measured oxidation potential (Eox) according to the following formula.

$$Ip(eV)=Eox+Ag/AgCl$$

Reference electrode–potential+normal hydrogen electrode potential=Eox+0.196+4.5

Measurement of oxidation potential was performed as follows. A sample was prepared by dipping an electrode in a chloroform solution of polymer compound 1 and drying it, a thin film was formed on the electrode. It was determined from the standup voltage of voltammogram by cyclic voltammetry (working electrode and counter electrode: platinum, reference electrode: Ag/AgCl electrode, sweep velocity: 50 mV/sec) using an acetonitrile solution of 0.1M tetrafluoro boric acid tetra-n-butyl ammonium as supporting electrolyte.

The ionization potentials of polymer compounds 1, 2, 3 and 4 were 5.45, 5.55, 5.35 and 5.31 eV, respectively. On the other hand, the ionization potential of polymer compound 5 was 6.01 eV. This result shows that the polymer compounds of the present invention have excellent charge transporting property.

The polymer compound of the present invention has strong fluorescence and/or excellent charge transporting property. It can be used suitably as a light-emitting material for polymer LED, or a charge transporting material. The polymer compound of the present invention can also be used as a coloring matter for lasers, a material for organic solar battery, an organic semiconductor for organic transistors, a material for conductive thin film, and a material for electronic device.

Furthermore, the polymer LED using the polymer compound of the present invention is a high performance polymer LED which can be driven at a low-voltage. Therefore, the polymer LED can be preferably used for apparatus, such as a back light of a liquid crystal display or a light source of curved or plane surface for lighting, a segment type display device, and a flat-panel display of dot matrix.

What is claimed is:

1. A polymer compound having a polystyrene reduced number average molecular weight of $10^3$–$10^8$, and comprising one or more kinds of repeating units represented by formula (1) and one or more kinds of repeating units represented by formula (2),

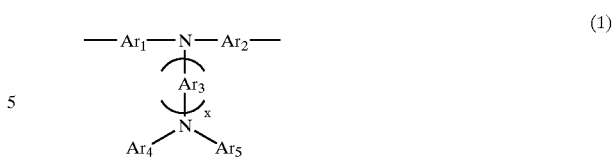

wherein, $Ar_1$ and $Ar_2$ each independently represent an arylene group or a divalent heterocyclic compound group; $Ar_3$ is an arylene group, arylene vinylene group, or a divalent heterocyclic compound group; x is 1 to 10; when x is two or more, $Ar_3$s may be the same or different; $Ar_4$ and $Ar_5$ are each independently an aryl group or a monovalent heterocyclic compound group, $$—Ar_6—\qquad(2)$$

wherein, $Ar_6$ is phenylene group, stilbene-diyl group, distilbene-diyl group, fluorene-diyl group, divalent condensed polycyclic aromatic compound group, divalent monocyclic hetero-ring group, divalent condensed polycyclic hetero-ring compound group, or divalent aromatic amine compound group.

2. A polymer compound according to claim 1, wherein $Ar_3$ is a group represented by the following formula (3),

wherein, Ring A represents phenylene, biphenylene, terphenylene, fluorene-diyl, naphthalene-diyl, anthracene-diyl, phenanthrene-diyl, pyridine-diyl, quinoxaline-diyl, and thienylene; $R_1$ represents an alkyl group, alkoxy group, alkylthio group, alkyl silyl group, aryl group, aryloxy group, arylsilyl group, arylalkyl group, arylalkoxy group, arylalkylsilyl group, arylalkenyl group, arylalkynyl group, monovalent heterocyclic compound group, or cyano group; y represents an integer of 0 to 4, and when y is two or more, a plurality of $R_1$s may be the same or different.

3. A polymer compound according to claim 1, wherein $Ar_3$ is a group represented by formula (4),

wherein, $R_2$ and $R_3$ each independently represent the same group with those of $R_1$; $R_4$ and $R_5$ each independently represent a hydrogen atom, an alkyl group, aryl group, arylalkyl group, monovalent heterocyclic compound group, or cyano group; z and w each independently represent an integer of 0 to 4.

4. A polymer compound according to any one of claims 1 to 3, wherein the repeating unit represented by formula (2) is a repeating unit represented by the following formula (5) or formula (6),

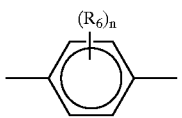

(5)

wherein, $R_6$ represents an alkyl group, alkoxy group, alkylthio group, alkylsilyl group, aryloxy group, arylsilyl group, arylalkyl group, arylalkoxy group, arylalkylsilyl group, arylalkenyl group, arylalkynyl group, monovalent heterocyclic compound group, or cyano group; n represents an integer of 0 to 4; when n is two or more, a plurality of $R_6$s may be the same or different,

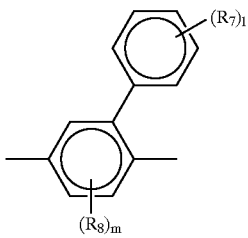

(6)

wherein, $R_7$ and $R_8$ each independently represent the same group with those of $R_1$; l represents an integer of 0 to 5; m represents an integer of 0 to 3; when l is two or more, a plurality of $R_7$s may be the same or different; when m is two or more, a plurality of $R_8$s may be the same or different.

5. A polymer compound according to any one of claims 1 to 3, wherein the repeating unit represented by formula (2) is a repeating unit represented by the following formula (7),

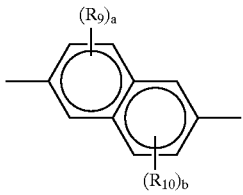

(7)

wherein, $R_9$ and $R_{10}$ each independently represent the same group with those of $R_1$; a and b each independently represent an integer of 0 to 3; when a is two or more, a plurality of $R_9$s may be the same or different; when b is two or more, a plurality of $R_{10}$s may be the same or different.

6. A polymer compound according to any one of claims 1 to 3, wherein the repeating unit represented by formula (2) is a repeating unit represented by the following formula (8),

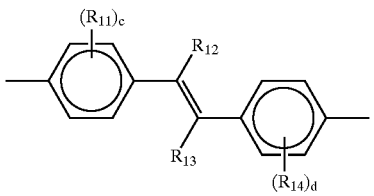

(8)

wherein, $R_{11}$ and $R_{14}$ represent the same group with those of $R_1$; c and d each independently represent an integer of 0 to 4; when c is two or more, a plurality of $R_{11}$s may be the same or different; when d is two or more, a plurality of $R_{14}$s may be the same or different; $R_{12}$ and $R_{13}$ each independently represent a hydrogen atom, an alkyl group, aryl group, arylalkyl group, monovalent heterocyclic compound group, or cyano group.

7. A polymer compound according to any one of claims 1 to 3, wherein the repeating unit represented by formula (2) is a repeating unit represented by the following formula (9),

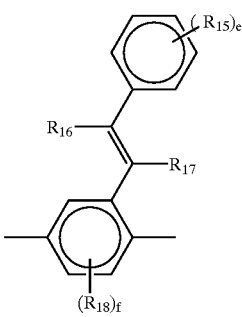

(9)

wherein, $R_{15}$ and $R_{18}$ each independently represent the same group with those of $R_1$; e represents an integer of 0 to 5; f represents an integer of 0 to 3; when e is two or more, a plurality of $R_{15}$s may be the same or different; when f is two or more, a plurality of $R_{18}$s may be the same or different; $R_{16}$ and $R_{17}$ each independently represent a hydrogen atom, an alkyl group, an aryl group, an aryl alkyl group, a monovalent heterocyclic compound group, or cyano group.

8. A polymer compound according to any one of claims 1 to 3, wherein the repeating unit represented by formula (2) is a repeating unit represented by the following formula (10),

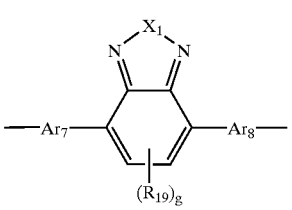

(10)

wherein, $Ar_7$ and $Ar_8$ each independently represent an arylene group which may have a substituent, or a divalent heterocyclic compound group; $R_{19}$ represent the same group with those of $R_1$; g represents an integer of 0 to 2; when g is 2, the two $R_{19}$ may be the same or different; and x1 is O or S.

9. A polymer compound according to any one of the claims 1 to 3, wherein the repeating unit represented by formula (2) is a repeating unit represented by the following formula (11),

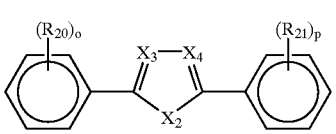

(11)

wherein, $R_{20}$ and $R_{21}$ each independently represent the same group with those of $R_1$; o and p each independently represent an integer of 0 to 4; when o is two or more, a plurality of $R_{20}$s may be the same or different; when p is two or more, a plurality of $R_{21}$s may be the same or different; $x_2$ is O, S or N—$R_{22}$ and $SiR_{23}R_{24}$; $x_3$ and $X_4$ each independently represent a group represented by N or C—$R_{25}$; $R_{22}$ to $R_{25}$ each independently represent a hydrogen atom, an alkyl group, aryl group, arylalkyl group, or monovalent heterocyclic compound group.

10. A polymer compound according to any one of claims 1 to 3, wherein the repeating unit represented by formula (2) is a repeating unit represented by the following formula (12), (12)

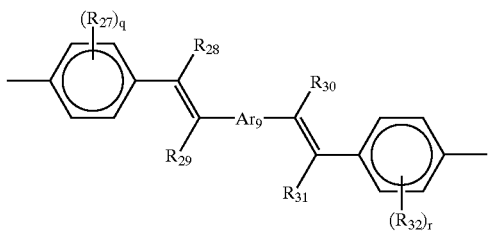

wherein, $Ar_9$ is an arylene group or a divalent heterocyclic compound group; $R_{27}$ and $R_{32}$ each independently represent the same group with those of $R_1$; q and r each independently represent an integer of 0 to 4; when q is two or more, a plurality of $R_{27}$s may be the same or different; when r is two or more, a plurality of $R_{32}$s may be the same or different; $R_{28}$–$R_{31}$ each independently represent a hydrogen atom an alkyl group, an aryl group, an aryl alkyl group, a monovalent heterocyclic compound group, or cyano group.

11. A polymer compound according to any one of claims 1 to 3 wherein the repeating unit represented by formula (2) is a repeating unit represented by the following formula (13), (13)

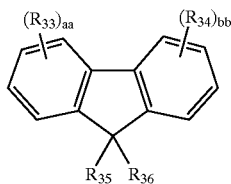

wherein, $R_{33}$, $R_{34}$, $R_{35}$, and $R_{36}$ each independently represent the same group with those of $R_1$; aa and bb each independently represent an integer of 0 to 3.

12. A polymer compound according to any one of claims 1 to 3 wherein the repeating unit represented by formula (2) is a repeating unit represented by the following formula (14), (14)

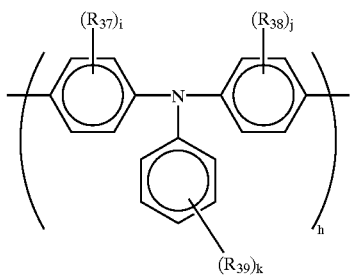

wherein, $R_{37}$, $R_{38}$, and $R_{39}$ each independently represent the same group with those of $R_1$; i and j each independently represent an integer of 0 to 4; k represents an integer of 0 to 5; h represents 1 or 2; when i is two or more, a plurality of $R_{37}$s may be the same or different; when j is two or more, a plurality of $R_{38}$s may be the same or different; when k is two or more, a plurality of $R_{39}$s may be the same or different.

13. A polymer compound according to any one of claims 1 to 3, wherein the repeating unit represented by formula (2) is a repeating unit represented by the following formula (15), (15)

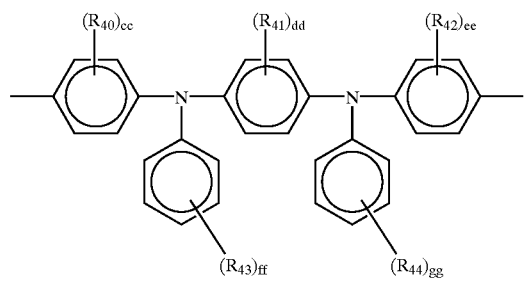

wherein, $R_{40}$–$R_{44}$ each independently represent the same group with those of $R_1$; cc, dd, and ee each independently represent an integer of 0 to 4; when cc is two or more, a plurality of $R_{40}$s may be the same or different; when dd is two or more, a plurality of $R_{41}$s may be the same or different; when ee is two or more, a plurality of $R_{42}$s may be the same or different; ff and gg each independently represent an integer of 0 to 5; when ff is two or more, a plurality of $R_{41}$s may be the same or different; when gg is two or more, a plurality of $R_{44}$s may be the same or different.

14. A polymer compound according to any one of claims 1 to 3, wherein the polymer compound comprises at least one repeating unit represented by the above formula (1), and at least one repeating unit selected from those represented by the above formulas (5) to (15).

15. A polymer compound according to any one of claims 1 to 3, wherein the polymer compound exhibits fluorescence in the solid state.

16. A polymer light-emitting device comprising at least a light emitting layer between a pair of electrodes composed of an anode and a cathode at least one of which is transparent or semitransparent, wherein said light emitting layer comprises a polymer compound according to claim 15.

17. A flat light source comprising a polymer light-emitting device according to claim 16.

18. A segment display apparatus comprising a polymer light-emitting device according to claim 16.

19. A dot-matrix display apparatus comprising a polymer light-emitting device according to claim 16.

20. A liquid crystal display using a polymer light-emitting device according to claim 16 as a back light.

* * * * *